(12) United States Patent
Deshpande et al.

(10) Patent No.: US 10,541,362 B2
(45) Date of Patent: Jan. 21, 2020

(54) APPARATUS AND METHODS FOR INTEGRATING MAGNETORESISTIVE DEVICES

(71) Applicant: Everspin Technologies, Inc., Chandler, AZ (US)

(72) Inventors: Sarin A. Deshpande, Chandler, AZ (US); Sanjeev Aggarwal, Scottsdale, AZ (US); Moazzem Hossain, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/380,589

(22) Filed: Apr. 10, 2019

(65) Prior Publication Data

US 2019/0237665 A1   Aug. 1, 2019

Related U.S. Application Data

(63) Continuation of application No. 15/958,444, filed on Apr. 20, 2018, now Pat. No. 10,297,747.
(Continued)

(51) Int. Cl.
*H01L 27/22* (2006.01)
*H01L 21/768* (2006.01)
(Continued)

(52) U.S. Cl.
CPC ............ *H01L 43/12* (2013.01); *G11C 11/161* (2013.01); *H01L 21/768* (2013.01);
(Continued)

(58) Field of Classification Search
CPC ...................................................... H01L 43/12
See application file for complete search history.

(56) References Cited

U.S. PATENT DOCUMENTS

| 7,205,164 B1 | 4/2007 | Geha et al. |
| 8,686,484 B2 | 4/2014 | Whig et al. |
| (Continued) | | |

FOREIGN PATENT DOCUMENTS

WO   2016122811 A1   8/2016

OTHER PUBLICATIONS

Hatton et al. "Materials chemistry for low-k materials" Materials Today, vol. 9, Issue 3, Mar. 2006, pp. 22-31.
(Continued)

*Primary Examiner* — William A Harriston
(74) *Attorney, Agent, or Firm* — Bookoff McAndrews, PLLC

(57) ABSTRACT

The present disclosure is drawn to, among other things, a method of fabricating an integrated circuit device having a magnetoresistive device. In some aspects, the method includes forming the magnetoresistive device on a first contact of a substrate, wherein the magnetoresistive device includes a fixed magnetic region and a free magnetic region separated by an intermediate region; depositing a first dielectric material over the magnetoresistive device; depositing a second dielectric material over the first dielectric material; polishing a surface of the second dielectric material; forming a first cavity through the polished surface of the second dielectric material to expose a surface of the magnetoresistive device; and depositing an electrically conductive material in the first cavity to form a via.

18 Claims, 18 Drawing Sheets

Related U.S. Application Data

(60) Provisional application No. 62/488,233, filed on Apr. 21, 2017.

(51) Int. Cl.
    *H01L 43/12*     (2006.01)
    *H01L 43/02*     (2006.01)
    *G11C 11/16*     (2006.01)
    *H01L 43/08*     (2006.01)

(52) U.S. Cl.
    CPC ............ *H01L 27/222* (2013.01); *H01L 43/02* (2013.01); *H01L 43/08* (2013.01)

(56) References Cited

U.S. PATENT DOCUMENTS

| | | |
|---|---|---|
| 8,747,680 B1 | 6/2014 | Deshpande et al. |
| 9,023,216 B2 | 5/2015 | Kochergin et al. |
| 9,136,464 B1 | 9/2015 | Whig et al. |
| 9,419,208 B2 | 8/2016 | Whig et al. |
| 10,297,747 B2 | 5/2019 | Deshpande et al. |
| 2011/0121417 A1 | 5/2011 | Li et al. |
| 2014/0167191 A1* | 6/2014 | Doyle .................... H01L 43/02 257/421 |

OTHER PUBLICATIONS

International Search Report and Written Opinion dated Jul. 26, 2018, in International Application No. PCT/US2018/028570 (18 pages).

\* cited by examiner

US 10,541,362 B2

APPARATUS AND METHODS FOR INTEGRATING MAGNETORESISTIVE DEVICES

CROSS-REFERENCE TO RELATED APPLICATIONS

This application is a continuation of and claims the benefit of priority to U.S. Nonprovisional application Ser. No. 15/958,444, filed Apr. 20, 2018, which claims the benefit of priority to U.S. Provisional Application No. 62/488,233, filed on Apr. 21, 2017, the entireties of which are incorporated herein by reference.

TECHNICAL FIELD

The present disclosure relates generally to magnetoresistive devices and more particularly to the integration of magnetoresistive devices on integrated circuits (IC).

INTRODUCTION

Magnetoresistive devices, such as magnetic sensors, magnetic transducers, and magnetic memory cells, include magnetic materials where the magnetic moments of those materials can be varied to provide sensing information or to store data. Magnetoresistive devices, spin electronic devices, and spintronic devices are synonymous terms for devices that make use of effects predominantly caused by electron spin. Magnetoresistive memory devices are used in numerous information devices to provide non-volatile, reliable, radiation resistant, and high-density data storage and retrieval. The numerous magnetoresistive devices may include, but are not limited to, Magnetoresistive Random Access Memory (MRAM), magnetic sensors, and read/write heads for disk drives.

Manufacturing magnetoresistive devices includes a sequence of processing steps wherein multiple layers of materials are deposited and patterned to form a magnetoresistive stack and the electrodes (or other electrical connectors) used to provide electrical connections to the magnetoresistive stack. The magnetoresistive stack includes the various regions or layers that make up "free" and "fixed" portions of the device as well as one or more intermediate regions (e.g., dielectric layers) that separate these "free" and "fixed" portions, and in some cases, provide at least one tunnel junction for the device. In many instances, the layers of material in the magnetoresistive stack may be relatively very thin, e.g., on the order of a few or tens of angstroms. The term "free" refers to ferromagnetic regions having a magnetic moment that may shift or move significantly in response to applied magnetic fields or spin-polarized currents used to switch the magnetic moment vector of a "free" region. And, the term "fixed" refers to ferromagnetic regions having a magnetic moment vector that does not move substantially in response to such applied magnetic fields or spin-polarized currents.

In some applications, magnetoresistive devices may be included on the same integrated circuit with additional surrounding circuitry. For example, magnetoresistive devices (MRAMs, magnetic sensors, magnetic transducers, etc.) may be included on an integrated circuit with a microcontroller or other processing circuitry configured to utilize the information collected by, or stored in, the magnetoresistive devices. Aspects of this disclosure describe magnetoresistive devices and techniques for manufacturing integrated circuits that include magnetoresistive devices that allow for performance enhancement and mitigation of processing-related issues.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments/aspects described herein. Further, the figures depict the different layers/regions of the illustrated stacks as having a uniform thickness and well-defined boundaries with straight edges. However, a person skilled in the art would recognize that, in reality, the different layers typically may have a non-uniform thickness. Further, in some cases, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain features are illustrated with straight 90-degree edges, in reality such features may be more "rounded" and/or gradually sloping or tapered.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Figure 1:
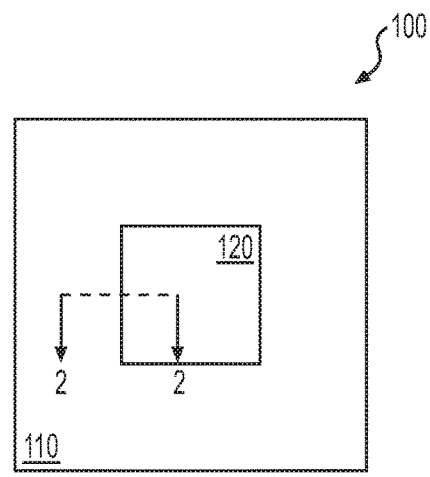
Figure 2:
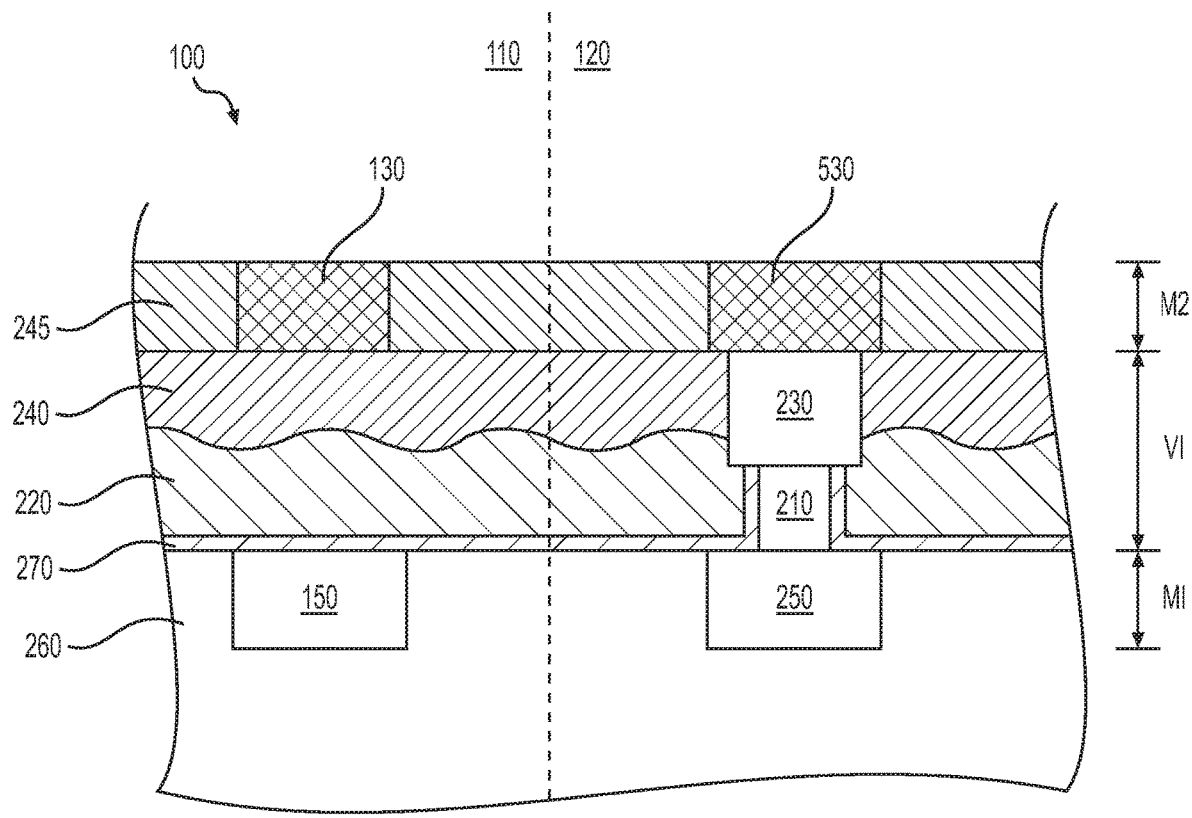
Figure 3:
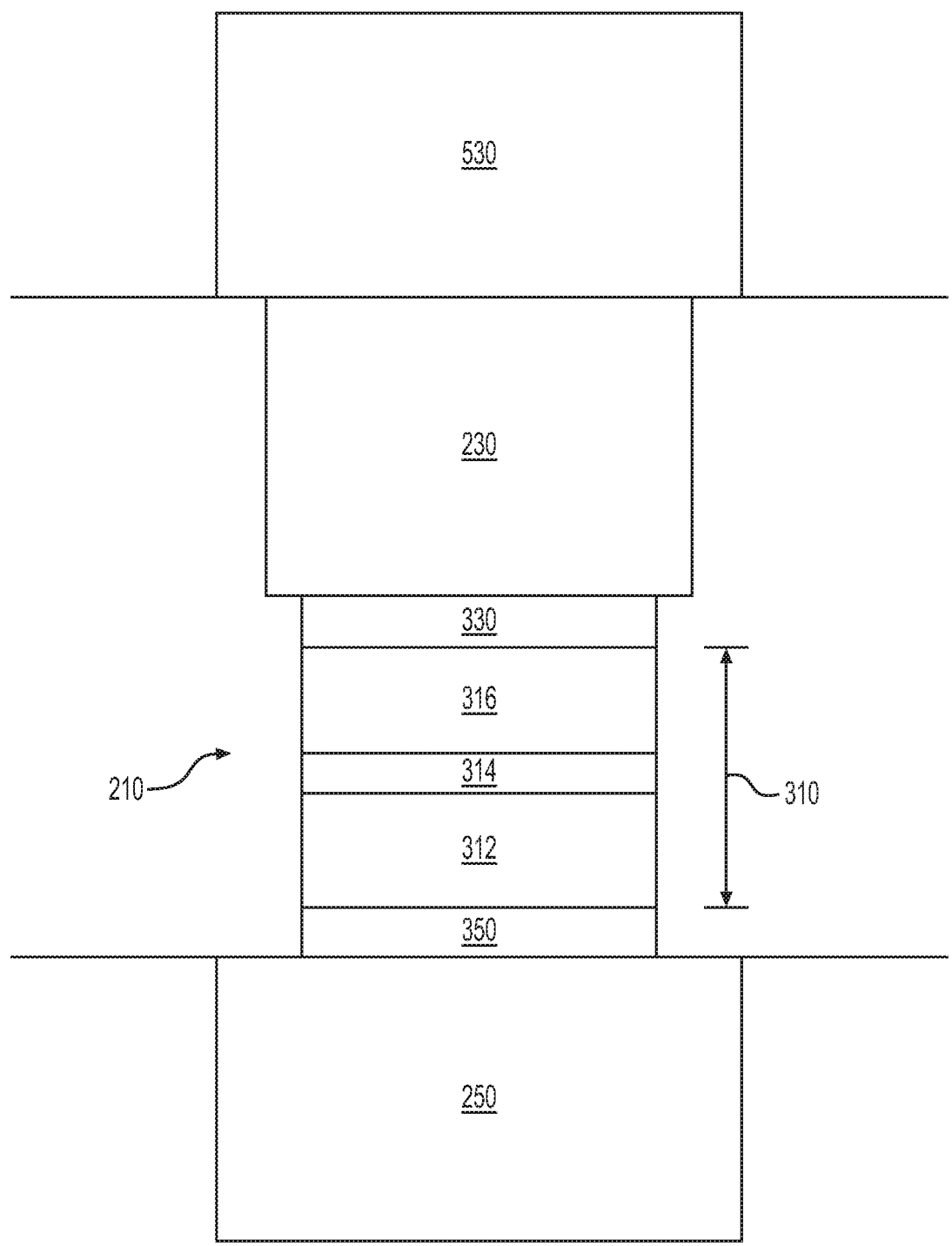
Figure 5:
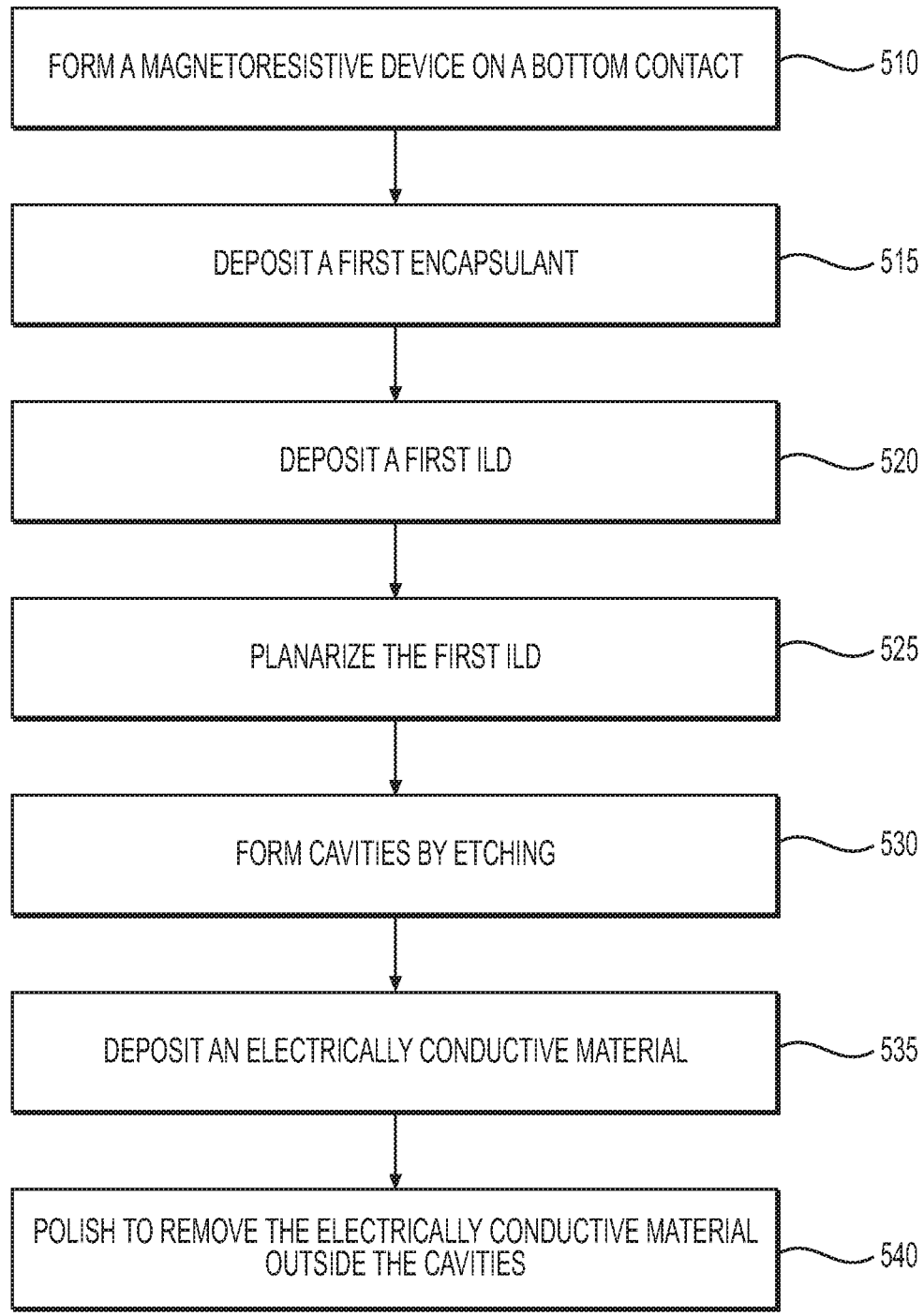
Figure 7A:
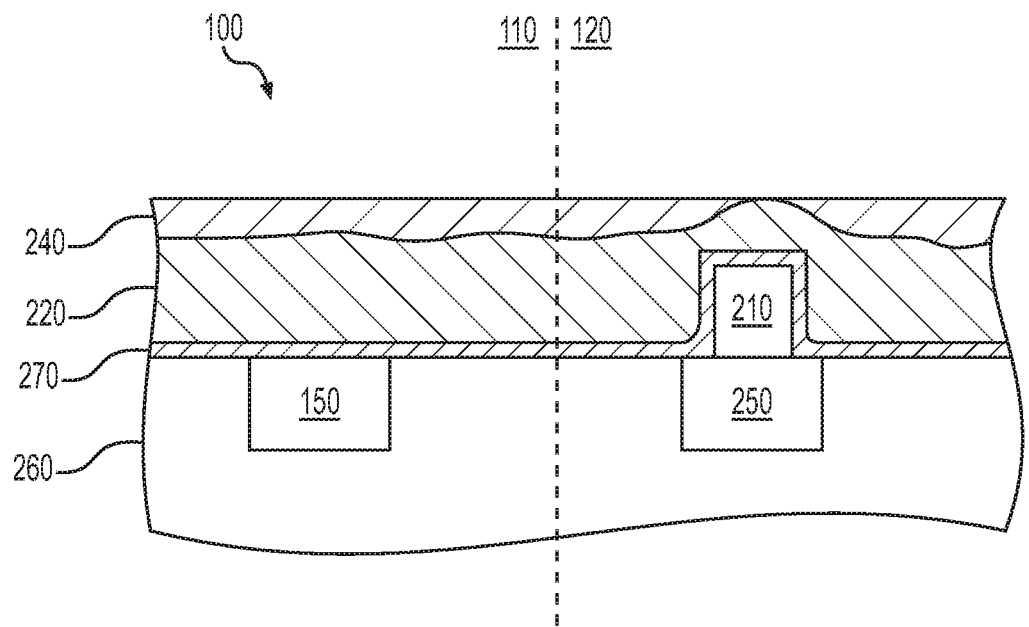
Figure 7B:
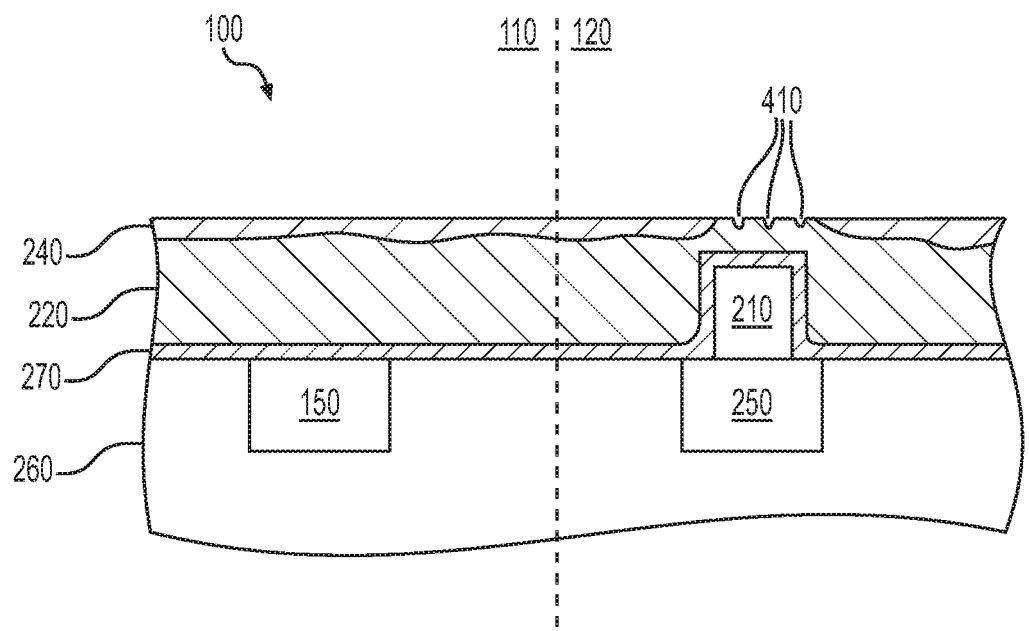
Figure 8:
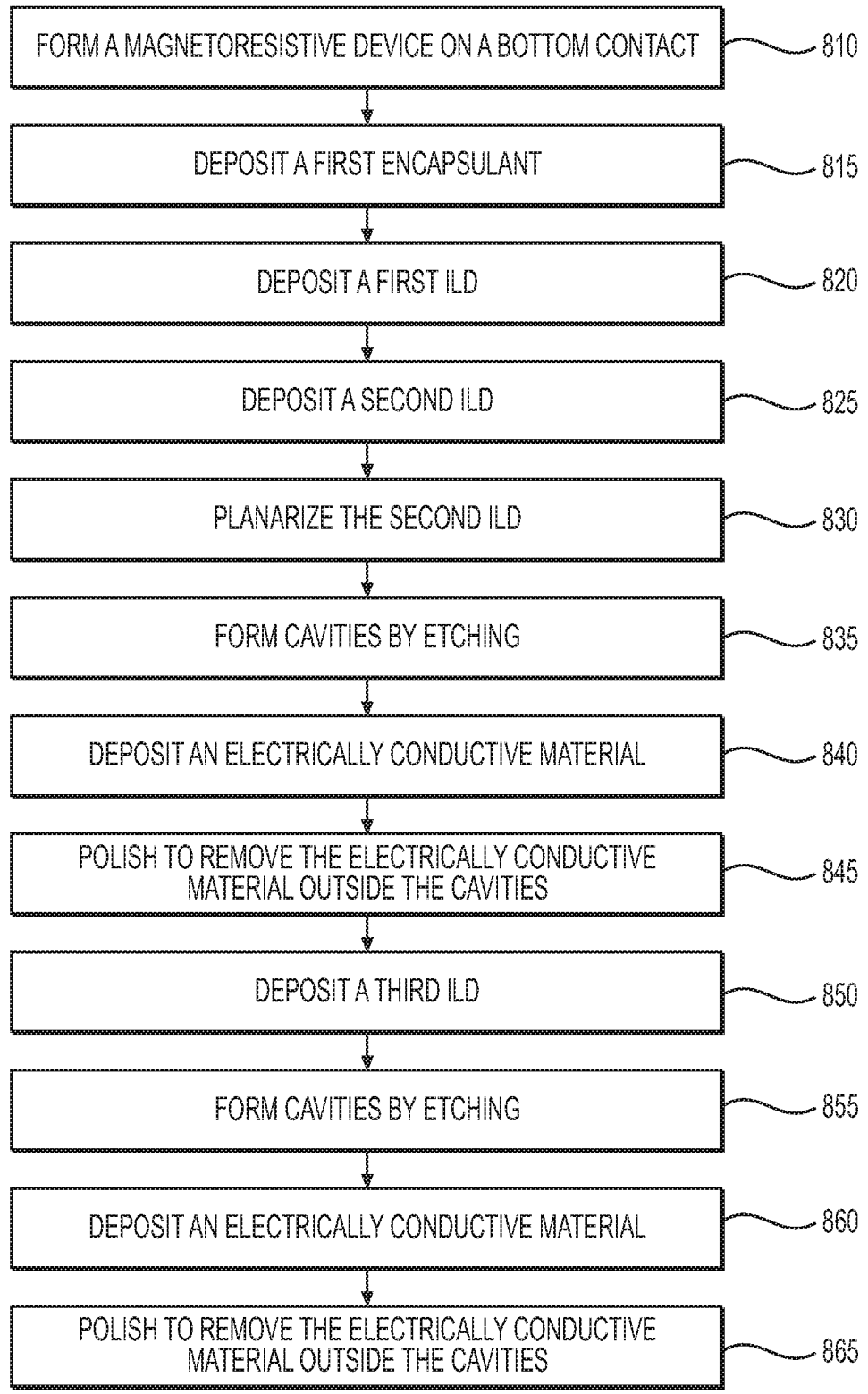
Figure 10:
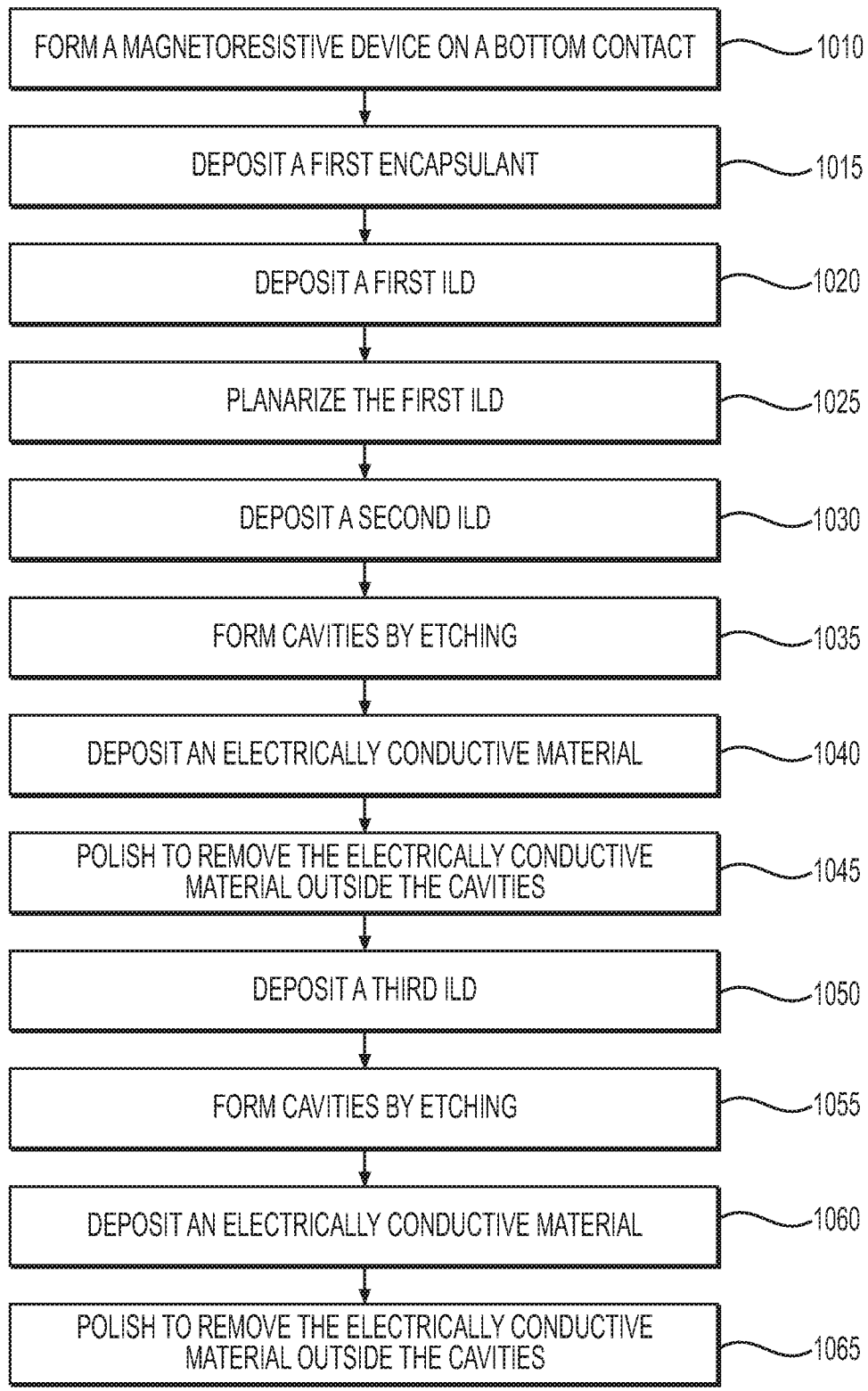

FIG. 1 is a schematic illustration of a top view an exemplary integrated circuit device of the current disclosure;

FIG. 2 is a schematic cross-sectional illustration of the exemplary integrated circuit device of FIG. 1;

FIG. 3 is a simplified cross-sectional illustration of an exemplary magnetoresistive device of the integrated circuit device of FIG. 1;

FIGS. 4A-4G are schematic cross-sectional illustrations of the integrated circuit device of FIG. 1 during different stages of fabrication in an exemplary embodiment;

FIG. 5 is a flowchart that illustrates an exemplary method of fabricating the integrated circuit device of FIG. 1;

FIGS. 6A-6F are schematic cross-sectional illustrations of the integrated circuit device of FIG. 1 during different stages of fabrication in another exemplary embodiment;

FIG. 7A-7B are schematic cross-sectional illustrations of the integrated circuit device of FIG. 1 during fabrication in another exemplary embodiment;

FIG. 8 is a flowchart that illustrates another exemplary method of fabricating the integrated circuit device of FIG. 1;

FIGS. 9A-9G are schematic cross-sectional illustrations of the integrated circuit device of FIG. 1 during fabrication in another exemplary embodiment;

FIG. 10 is a flowchart that illustrates another exemplary method of fabricating the integrated circuit device of FIG. 1.

Figure 12A:
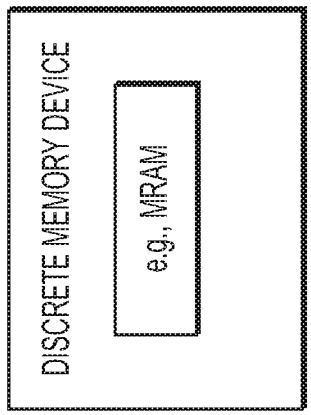
Figure 12B:
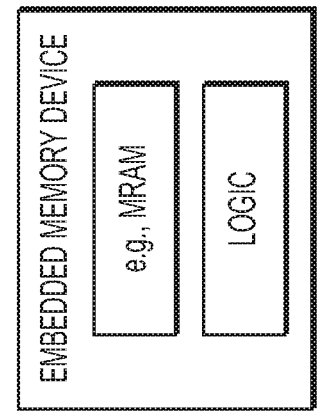
Figure 11:
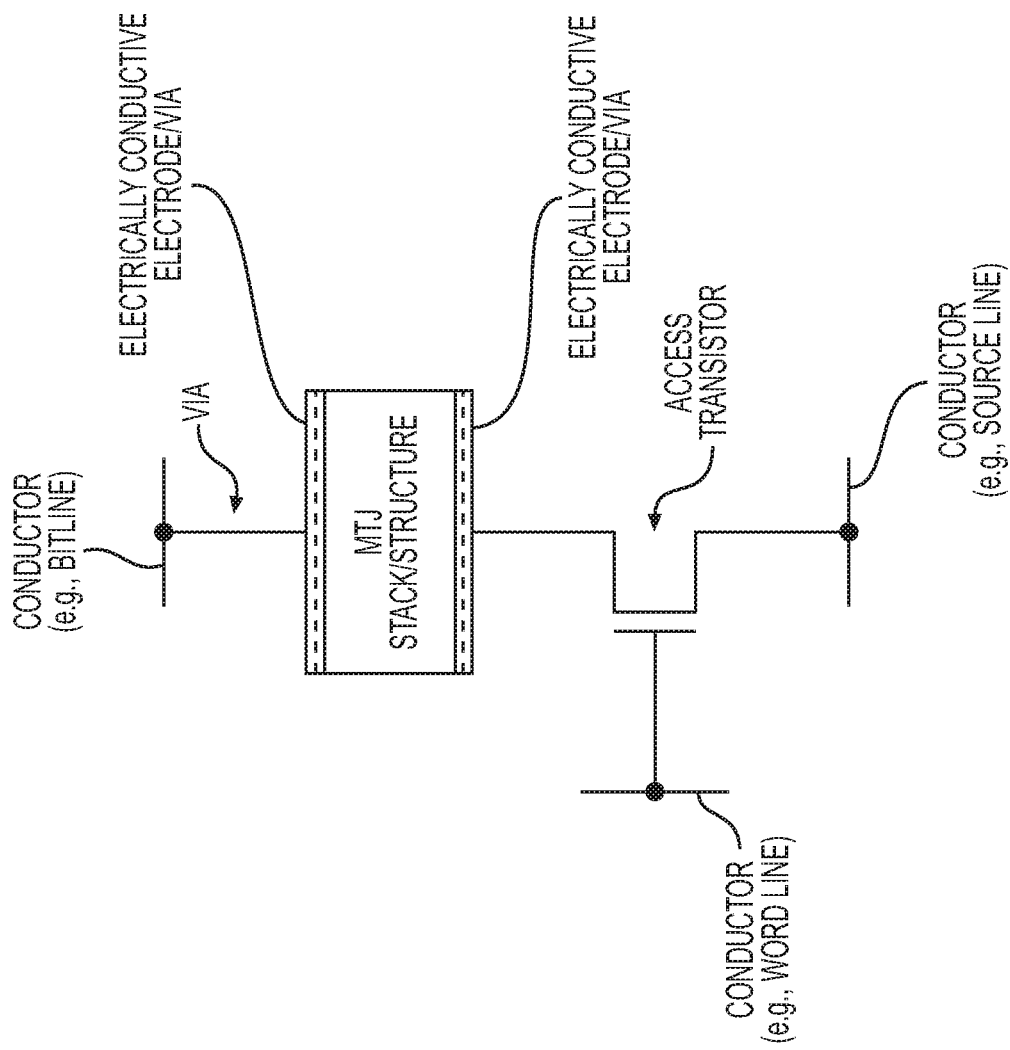

FIG. 11 is a schematic view of an exemplary integrated circuit device of the current disclosure; and FIGS. 12A-12B are illustrations of exemplary integrated circuit devices of the current disclosure.

DETAILED DESCRIPTION

There are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate that the embodiment(s) is/are "example" embodiment(s). Further, even though the figures and description appear to describe a particular order of construction (e.g., from bottom to top), it is understood that the depicted structures may have the opposite order (e.g., from top to bottom), or a different order.

The terms "comprise," "include," "have" and any variations thereof are used synonymously to denote or describe non-exclusive inclusion. As such, a process, method, article, or apparatus that uses such terms does not include only those steps, structure, or elements but may include other steps, structures or elements not expressly listed or inherent to such process, method, article, or apparatus.

Further, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. As noted above, the term "exemplary" is used in the sense of "example," rather than "ideal."

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

In this disclosure, the term "region" is used generally to refer to one or more layers of material. That is, a region (as used herein) may include a single layer (or film or coating) of material or multiple layers or coatings (or films) of materials stacked one on top of another to form a multi-layer system. Further, although in the description below, the different regions in the disclosed stack/structure are sometimes referred to by specific names (such as, e.g., capping layer, reference layer, transition layer, etc.), this is only for ease of description and not intended as a functional description of the layer.

For the sake of brevity, conventional techniques related to semiconductor processing may not be described in detail herein. The exemplary embodiments described herein may be fabricated using known lithographic processes. The fabrication of integrated circuits, microelectronic devices, micro electro mechanical devices, microfluidic devices, and/or photonic devices may involve the creation of several layers of materials that interact in some fashion. One or more of these layers may be patterned so various regions of the layer have different electrical or other characteristics, and the various regions may be interconnected within the layer or to other layers to create electrical components and circuits. These regions may be created by selectively introducing or removing various materials. The patterns that define such regions are often created by lithographic processes. For example, a layer of photoresist may be applied onto a layer overlying a wafer substrate. A photo mask (containing clear and opaque areas) may be used to selectively expose the photoresist by a form of radiation, such as ultraviolet light, electrons, or x-rays. Either the photoresist exposed to the radiation, or the photoresist that is not exposed to the radiation, is removed by the application of a developer. An etch may then be applied to the underlying layer not protected by the remaining photoresist such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing integrated circuits that include magnetoresistive devices having electrical conductive electrodes on either side of a magnetic material stack. While not described in detail herein, the magnetic material stack may include many different layers of material, where some of the layers include magnetic materials, whereas others do not. In some embodiments, the methods of manufacturing include forming the layers of the magnetoresistive devices and then masking and etching those layers to produce a plurality of magnetoresistive devices. Examples of such devices include transducers such as electromagnetic sensors as well as memory cells.

Magnetoresistive devices can be included on an integrated circuit with other circuitry. In such cases, it is desirable to align the process steps and structures associated with the magnetoresistive devices with the process steps and circuit features associated with the surrounding circuitry. In other words, integrating the manufacture of the magnetoresistive devices into the standard process flow used to manufacture the integrated circuits may be desirably performed in a manner that minimizes the number of additional processing steps and materials needed during production as well as optimizing the thermal budget for the magnetoresistive devices. For example, while some process steps and materials associated with building magnetoresistive devices may be specific to such devices, other process steps and materials used in manufacturing magnetoresistive devices also may be used in manufacturing the surrounding circuitry. As a specific example, conductive layers that are deposited and patterned to form the top and/or bottom electrodes for magnetoresistive devices can also be used to form connective traces and interlayer connections in standard complementary metal oxide semiconductor (CMOS) process flows. As an additional example, embodiments are disclosed in which the interlayer dielectric used in the portion of the integrated circuit that includes magnetoresistive devices is the same interlayer dielectric used in some other areas of the integrated circuit. Such reuse eliminates the need for additional magnetoresistive-device-specific processing and materials.

FIG. 1 illustrates an exemplary integrated circuit (IC) device 100 that includes a logic portion 110 and a magnetoresistive device portion 120. Logic portion 110 may include logic circuits and other circuits that may typically be manufactured using conventional process flows. The magnetoresistive device portion 120 may include one or more magnetoresistive devices such as, for example, magnetic memory devices (MRAMs), magnetic sensors, magnetic transducers, etc. For brevity, the magnetoresistive device portion 120 is hereinafter referred to as the memory portion 120. As described above, however, memory portion 120 may include any suitable magnetoresistive device (MRAMs, sensors, transducers, etc.). The logic portion 110 may include logic circuit elements that may be inter-coupled using a plurality of metal layers. As discussed in additional detail below, specific embodiments are presented that include at least two layers of metal, often referred to as metal layer 1 (M1) and metal layer 2 (M2). Other embodiments may include a greater or lesser number of metal layers. For example, three or more layers of metal. The multiple layers of metal may be vertically spaced-apart from each other and separated by a dielectric material (called interlayer dielectric or ILD). In order to provide electrical coupling between these multiple metal layers (and circuit elements), vias may be formed through the dielectric material (i.e., the ILD) that separates adjacent metal layers. Without limitation, the vias may be formed by any electrically conductive material (e.g., copper (Cu), tantalum (Ta), tantalum nitride (TaN), cobalt tungsten phosphide (CoWP), copper with Ta/TaN or CoWP as a barrier material, etc.). Vias are holes, cavities, or openings in the ILD within which electrically conductive material is deposited or otherwise provided in order to provide an electrical path or conduit between two metal layers (e.g., metal layers M1 and M2) on either side of the ILD. In some aspects, the ILD may surround and insulate the vias and/or interconnect wiring of the IC device 100.

Although not shown in FIG. 1, in some cases, the IC device 100 may include a buffer portion between the logic portion 110 and the memory portion 120. The buffer portion may include, e.g., "dummy" magnetoresistive devices that are not intended for active operation. Instead, such "dummy" magnetoresistive devices may be used to facilitate processing of IC device 100. For example, polishing of the IC device 100 may result in "dishing," where an uneven surface results due to the abrupt change from a high density of magnetoresistive devices in portion 120 to a lack of such devices in portion 110. To alleviate such issues, in some embodiments, the buffer portion between the logic and magnetic portions 110, 120 may include "dummy" magnetoresistive devices patterned or tiled to maintain a desired density of magnetoresistive devices between portions 110 and 120. Additionally or alternatively, in some embodiments, other structures designed to facilitate processing may be provided in the buffer portion.

FIG. 2 is a schematic cross-sectional view of a portion of the IC device 100 of FIG. 1 (along the plane 2-2 identified in FIG. 1). In FIG. 2, the vertical structure on the right illustrates the circuitry associated with an exemplary magnetoresistive device 210 of the memory portion 120, and the vertical structure on the left illustrates an exemplary logic circuit of the logic portion 110. Regions identified as M1 and M2 in FIG. 2 correspond to the vertical space associated with the first metal layer (e.g., metal layer M1) and the second metal layer (e.g., metal layer M2), respectively of a semiconductor substrate 260 (e.g., a semiconductor substrate having electrical circuits (e.g., CMOS circuits) formed thereon), and V1 corresponds to the vertical space that extends between the first metal layer and the second metal layer. Bottom contacts 150, 250 (e.g., trace, pad, via, or other connection point) in the first metal layer M1 may be features or structures formed of an electrically conductive material. Similarly, top contacts 130, 530 (e.g., trace, pad, via, or other connection point) in the second metal layer M2 may be features or structures formed of an electrically conductive material. Without limitation, the bottom contacts 150, 250 and top contacts 130, 530 may be formed by any electrically conductive material (e.g., copper (Cu), tantalum (Ta), tantalum nitride (TaN), cobalt tungsten phosphide (CoWP), copper with Ta/TaN or CoWP as a barrier material, etc.). Moreover, either of bottom contacts 150, 250 or top contacts 130, 530 may be eliminated without departing from the scope of the present disclosure. The space between the bottom contacts 150 and 250 may be occupied by a dielectric or an insulating material. The space between the top contacts 130 and 530, and the vertical space between the top and bottom contacts (i.e., region V1) may also be occupied by one or more dielectric materials (called inter-layer dielectric materials (ILDs)).

With reference to the memory portion 120 of FIG. 2, a magnetoresistive device 210 may be embedded between metal layer M1 and metal layer M2 of the IC device 100. Further, a via 230 (sometimes referred to as an MVia) may be formed between the top contact 530 and the magnetoresistive device 210 to provide electrical connection to the magnetoresistive device 210. The space around the magnetoresistive device 210 may be occupied by one or more ILD materials. In an exemplary embodiment, the vertical space V1 may be occupied by a first ILD 220 and a second ILD 240 upon completion of processing. In some exemplary embodiments, the first ILD 220 may include a low-k dielectric material (e.g., a dielectric constant which is less than or equal to 3.5, and preferably less than or equal to 3.0) and second ILD 240 may include a conventional ILD material. The space between the top contacts 130 and 530, e.g., in the region identified as M2 in FIG. 2) may be occupied by a third ILD 245, which may be the same or different dielectric material as one of first and second ILDs 220, 240.

Conventional ILD materials include materials such as, for example, silicon dioxide ($SiO_2$), TEOS (Tetraethyl Orthosilicate), silicon nitride, etc. These ILD materials typically have a relatively high dielectric constant. As IC devices scale smaller, transistors get closer together, and spacing between interconnects in the circuit decrease. The associated higher resistance and capacitive coupling may cause signal delay, known as RC delay, in the circuit. Lowering the dielectric constant, or the "k" value, of the ILD decreases the RC delay, lowers power consumption, and reduces "crosstalk" between nearby interconnects. There are many known low-k (or ultra low-k) materials that may be used as the ILD in IC devices. See, for example, "Materials chemistry for low-k materials," Materials Today, Volume 9, Issue 3, March 2006, Pages 22-31, which is incorporated by reference in its entirety herein. There is also a significant amount of ongoing research to determine suitable low-k and ultra low-k ILD materials for IC applications. In the discussion below, both low-k and ultra low-k ILD materials are collectively referred to as low-k ILD materials. First ILD 220 may include any currently-known (flourine-doped silicon dioxide or silicas, carbon-doped silicon dioxide or silicas (e.g., SiCOH), porous silicon dioxide, spin-on organic polymeric dielectrics, spin-on silicon based polymeric dielectric SiCOH, etc.) or future-developed low-k ILD material.

In general, second ILD 240 may include any dielectric material having a higher dielectric constant than the first ILD 220. In some embodiments, first ILD 220 may be a low-k dielectric and second ILD 240 may include a conventional ILD material. In some embodiments, second ILD 240 may include a dielectric material that is relatively more dense than the material of the first ILD 220. In some embodiments, the density of the second ILD 240 may be between about 0.7-2 gm/mL. In some embodiments, the second ILD 240 may include, but is not limited to, low-temperature TEOS, silicon dioxide ($S_rO_2$), silicon nitride, etc.

As those of ordinary skill in the art will recognize, there are challenges to the implementation of low-k ILD materials in IC devices. For example, incorporating such materials in an IC device requires processing these materials with conventional IC fabrication processes. In some cases, to achieve a sufficiently low "k" value in a dielectric material, porosity may be introduced into the material. In some aspects, the porosity may be introduced by way of air bubbles in the ILD material. Porosity, however, may reduce the mechanical strength or integrity of the ILD material significantly, potentially causing issues during processing of the device. For example, fabrication of a typical IC device may include one or more polishing operations (e.g., chemical mechanical planarization (CMP), etc.) used to smooth or planarize the surface of a deposited ILD material. It is known that polishing of a porous low-k ILD material could introduce defects (e.g., by creating pits and cavities) in the material, which could result in an uneven surface of the ILD. Moreover, such defects may cause material entrapment that leads to undesirable sneak paths or short circuits, and other issues, during fabrication. The resulting uneven surface of the ILD may also cause issues during subsequent processing operations (photolithography, deposition, etc.). As will be described below, in some embodiments of the current disclosure, the fabrication process of the IC device 100 may be adapted to incorporate low-k ILD materials in the device without causing processing-related issues.

FIG. 3 is a simplified cross-sectional illustration of the magnetoresistive device 210 of FIG. 2. Magnetoresistive device 210 may include a magnetoresistive stack 310 that includes a plurality of magnetic material regions 312, 316 separated by one or more intermediate region(s) 314 positioned between electrical contact elements (e.g., top electrode 330 and the bottom electrode 350) on either side. As alluded to above, either or both of top electrode 330 or bottom electrode 350 may be eliminated without departing from the scope of the present disclosure. In some embodiments, the intermediate region(s) 314 may be made of a dielectric material and may form one or more tunnel junctions of the magnetoresistive device 210. For example, in some embodiments, the magnetoresistive stack 310 may include an intermediate region 314 formed of a dielectric material sandwiched between a magnetically "fixed" region 312 and a magnetically "free" region 316. The term "free" refers to ferromagnetic regions having a magnetic moment that may shift or move significantly in response to applied magnetic fields or spin-polarized currents used to switch the magnetic moment vector of a "free" region. And, the term "fixed" refers to ferromagnetic regions having a magnetic moment vector that does not move substantially in response to such applied magnetic fields or spin-polarized currents.

In some embodiments, fixed region 312 may include one or more layers of ferromagnetic alloys (comprising some or all of cobalt, iron, nickel, and boron, etc.), and free region 316 may comprise one or more layers of ferromagnetic alloys (comprising nickel, iron, cobalt, boron, etc.). In some cases, the layers of the ferromagnetic alloys of the free or fixed regions may be separated by a coupling layer (comprising, e.g., one or more of tantalum, tungsten, molybdenum, ruthenium, rhodium, rhenium, iridium, chromium, osmium, etc.). And, in some embodiments, the intermediate region 314 may include a dielectric oxide material such as, for example, aluminum oxide, magnesium oxide, etc. In some embodiments, the intermediate region 314 may include a conductive material (including, but not limited to, a non-magnetic conductive material such as, e.g., copper, gold, or alloys thereof) to form a giant magnetoresistive (GMR) type device.

It should be noted that the configuration of the magnetoresistive stack 310 illustrated in FIG. 3 is only exemplary. As a person skilled in the art would recognize, magnetoresistive stack 310 may have many configurations. In general, the magnetoresistive stack 310 may comprise at least one "fixed" magnetic region 312 (hereinafter referred to as fixed region 312), at least one "free" magnetic region 316 (hereinafter referred to as free region 316), and at least one intermediate region 314 disposed between the fixed and the free regions 312, 316. Magnetoresistive device 210 may have any now-known or future-developed magnetoresistive stack configuration. U.S. Pat. Nos. 8,686,484; 8,747,680; 9,023,216; 9,136,464; and 9,419,208, and U.S. patent application Ser. Nos. 15/831,736 (filed Dec. 5, 2017); 62/591,945 (filed Nov. 29, 2017); 62/594,229 (filed Dec. 4, 2017); 62/580,612 (filed Nov. 2, 2017); 62/582,502 (filed Nov. 7, 2017), and 62/588,158 (filed Nov. 17, 2017) describe exemplary magnetoresistive stacks that may be used in magnetoresistive device 210. These U.S. patents and applications are incorporated by reference in their entireties herein.

As illustrated in FIG. 3, the bottom electrode 350 of the magnetoresistive device 210 may be in electrical contact with the bottom contact 250, and the top electrode 330 of the magnetoresistive device 210 may be in electrical contact with the top contact 530 through a via 230. These electrodes 330, 350 may be formed of an electrically conductive material that enables the magnetoresistive stack 310 to be accessed by surrounding circuitry. Although any electrically conductive material may be used for bottom and top electrodes 350, 330, in some embodiments, a metal such as tantalum (Ta), titanium (Ti), tungsten (W), or a composite or alloy of these elements (e.g., tantalum-nitride alloy) may be used. In some embodiments, one or both of the bottom electrode 350 and the top electrode 330 may be eliminated. For example, in some embodiments, the bottom electrode 350 may be eliminated and the bottom contact 250 (which is electrically connected to circuitry of the magnetoresistive device 210) may directly provide electrical connection to the stack 310. Similarly, in some embodiments, the top contact 530 may directly provide, through the via 230, electrical connectivity between surrounding circuitry and the magnetoresistive stack 310.

Exemplary methods of fabricating an exemplary IC device 100 will now be described. Since different processes (e.g., deposition techniques, etching techniques, polishing techniques, etc.) involved in the manufacturing of IC devices are well known in the art, detailed description of these techniques is omitted for the sake of brevity. Since the magnetoresistive device 210 is disposed between metal layers M1 and M2 (for example, as shown in the embodiment of FIG. 2) of the IC device 100, processing of the IC device 100 below metal layer M1 and above metal layer M2 is not discussed herein. As would be recognized by a person of ordinary skill in the art, processing of the IC device below the M1 layer and above the M2 layer may be performed using conventional IC fabrication processes known in the art. In some embodiments, during fabrication of IC device 100, processing of the memory portion 120 may be compartmentalized, such that, before such processing begins and/or after such processing is complete, a known standard process flow for the IC device 100 may be used. In some embodiments, some of the standard process steps and materials may also be used in the compartmentalized portion of the processing (e.g., the processing used for the memory portion 120), thereby reducing any additional burden associated with the inclusion of magnetoresistive devices 210 in the IC device 100.

Figure 4A:
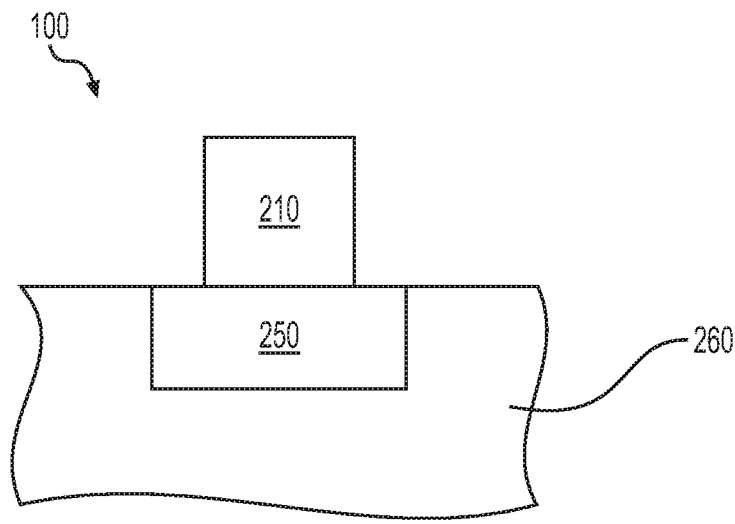

FIGS. 4A-4G are schematic cross-sectional illustrations of an exemplary IC device 100 (partially formed IC device) of the current disclosure during different stages of an exemplary fabrication process. FIG. 5 is a flowchart that illustrates the exemplary fabrication process represented in FIGS. 4A-4G. In the discussion below, reference will be made to FIGS. 4A-4G and 5. After the semiconductor substrate 260 is processed using conventional IC fabrication techniques up to the M1 metal layer, magnetoresistive devices 210 may be formed on (or in electrical contact with) bottom contacts 250 in the memory portion 120 of the substrate 260 (step 510). FIG. 4A illustrates a magnetoresistive device 210 formed on a bottom contact 250 in an exemplary embodiment. Forming the magnetoresistive device 210 may include depositing (e.g., sequentially depositing) the regions that comprise the device 210 on or above the bottom contact 250. For example, in embodiments, where a magnetoresistive device 210 having the configuration illustrated in FIG. 3 is used, forming the magnetoresistive device 210 may include sequentially depositing (by any known material deposition processes, such as, for example, sputtering, physical vapor deposition, chemical vapor deposition, etc.) the materials that form the bottom electrode 350, fixed region 312, intermediate region 314, free region 316, and top electrode 330 (as well as any other suitable layers or regions), to form the magnetoresistive device 210. In some embodiments, forming the magnetoresistive device 210 may also include other known processes (such as, for example, etching, photolithography, etc.).

Figure 4B:
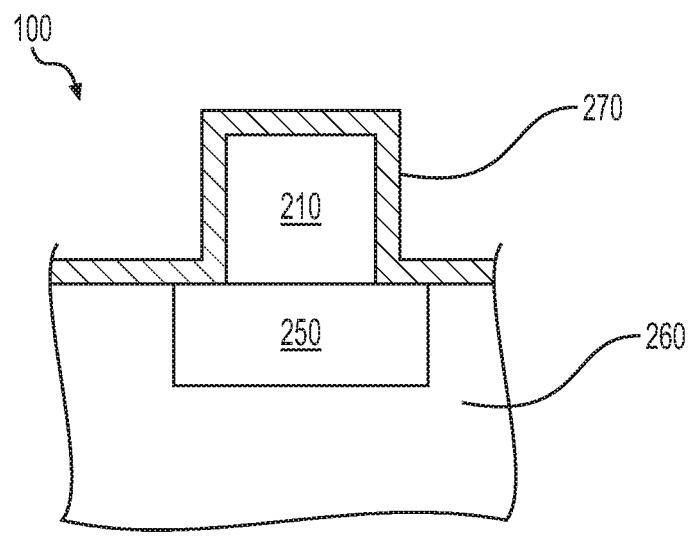

After the magnetoresistive devices 210 are formed as described above, a first encapsulant 270 may be provided on the magnetoresistive devices 210 (step 515). FIG. 4B is a schematic illustration of the first encapsulant 270 on the magnetoresistive device 210 of FIG. 4A. In some embodiments, the first encapsulant 270 may be deposited (e.g., as a conformal coating) to cover the surfaces of the formed magnetoresistive devices 210 and the exposed surfaces of the substrate 260. Any suitable process (e.g., chemical vapor deposition (CVD), atomic layer deposition (ALD), etc.) may be used to deposit the first encapsulant 270. The first encapsulant 270 may, in general, include any electrically non-conductive material. In some embodiments, silicon nitride (e.g., $Si_3N_4$, SiN, etc.) or silicon oxide (e.g., $SiO_2$, $SiO_x$, etc.) may be used as the first encapsulant 270. However, other materials such as, for example, aluminum oxide (such as, e.g., $Al_2O_3$), magnesium oxide (such as, e.g., MgO), a Tetraethyl orthosilicate (TEOS), and/or one or more combinations thereof, may also be used as the first encapsulant 270. In some embodiments, the first encapsulant 270 may be initially deposited as a conductor (for example, an oxidizable or nitridizable metal such as aluminum or magnesium), and thereafter oxidized or nitridized to change or transform at least a portion of the deposited material to an insulating material. In general, the first encapsulant 270 may have any thickness. In some embodiments, the thickness of the first encapsulant 270 may be about 10-500 Å, preferably about 50-300 Å, and more preferably about 100-300 Å.

After coating the magnetoresistive devices 210 with first encapsulant 270, a first ILD 220 may be used to cover the coated magnetoresistive devices 210 (step 520) as well as associated areas of substrate 260, e.g., in between adjacent magnetoresistive devices 210. Those of ordinary skill in the art will recognize that a memory according to the present disclosure may have an array of magnetoresistive devices 210.

Figure 4C:
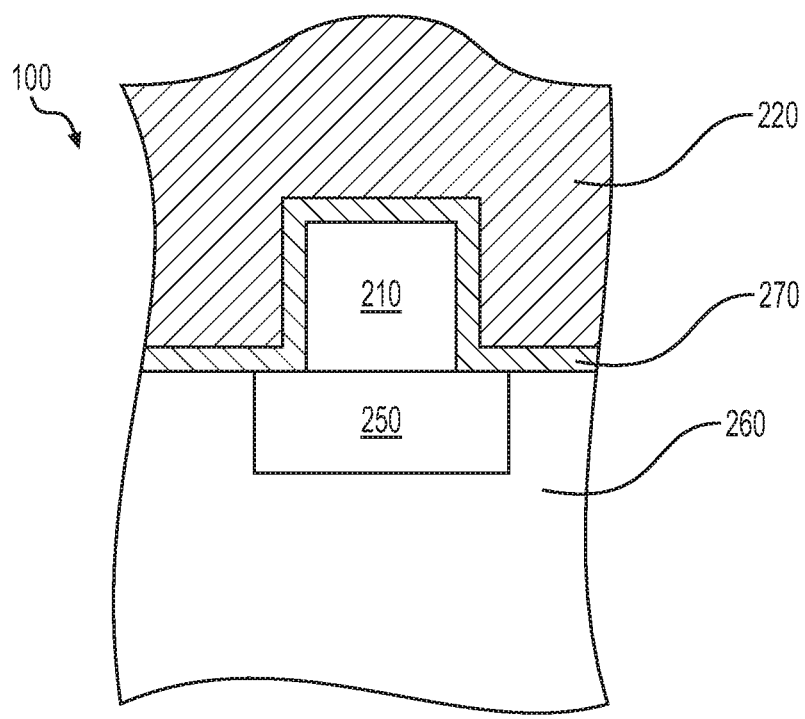

FIG. 4C is a schematic illustration of the coated magnetoresistive devices 210 of FIG. 4B covered by the first ILD 220. Any suitable process (e.g., CVD, ALD, etc.) may be used to deposit the first ILD 220. In general, first ILD 220 may include a conventional ILD dielectric material (e.g., TEOS, silicon dioxide ($S_iO_2$), silicon nitride, etc.) or a low-k dielectric material (e.g., flourine-doped silicon dioxide or silicas, carbon-doped silicon dioxide or silicas (e.g., SiCOH), porous silicon dioxide, spin-on organic polymeric dielectrics, spin-on silicon based polymeric dielectric SiCOH, etc.). However, as previously explained, for better electrical performance (e.g., lower RC delay, etc.) of IC device 100, it may be desirable to use a low-k dielectric material as the first ILD 220 (e.g., a dielectric constant which is less than or equal to 3.5, and preferably less than or equal to 3.0). As explained previously, in some embodiments, the low-k dielectric materials may have a high porosity (e.g., porosity of 30-39%). While the high porosity may be beneficial to lower the dielectric constant (and decrease RC delay, reduce power consumption, reduce "cross-talk" between nearby interconnects, etc.), it may induce defects during the manufacturing process, as explained below.

Figure 4D:
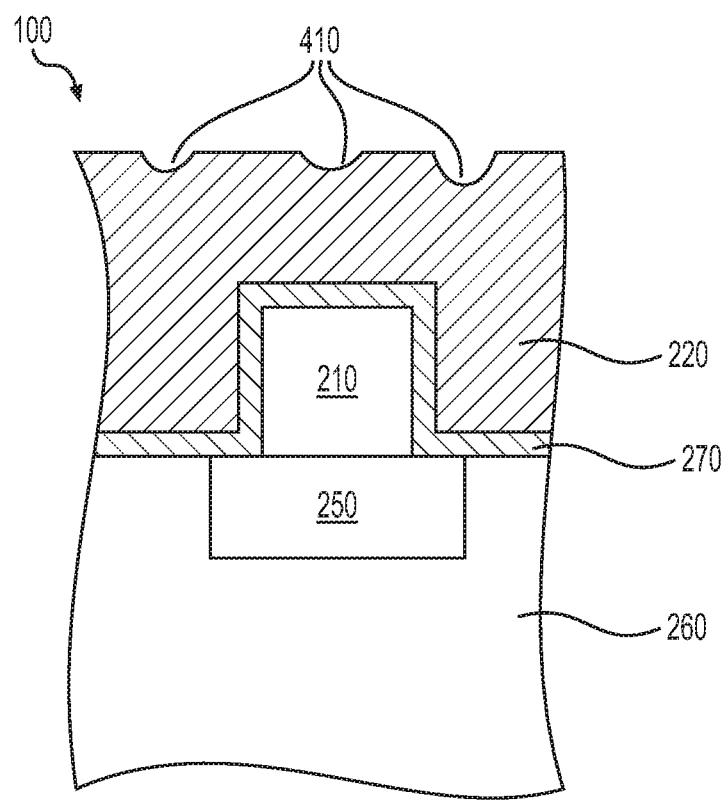

The exposed surface of the deposited first ILD 220 may then be planarized (step 525). FIG. 4D is a schematic illustration of the IC device 100 with the exposed surface of first ILD 220 after a suitable planarizing process. Any known process may be used to planarize the surface of the first ILD 220. Planarizing the first ILD 220 may prepare the surface for subsequent operations such as photolithography and etching to create a via opening, and ultimately to deposit other layers or regions of the contemplated memory devices. In some embodiments, a technique, such as, for example, chemical mechanical polishing (CMP) may be used to planarize the first ILD 220. Since CMP processes are known in the art, they are not described herein. When a low-k dielectric material is used as the first ILD 220, the polishing process when directly applied to the first ILD 220 surface may create pits 410 (or other undesirable surface irregularities) on the surface as shown in FIG. 4D. As will be explained in greater detail, such pits 410 or surface irregularities may increase the incident of a short circuit or current sneak paths.

Figure 4E:
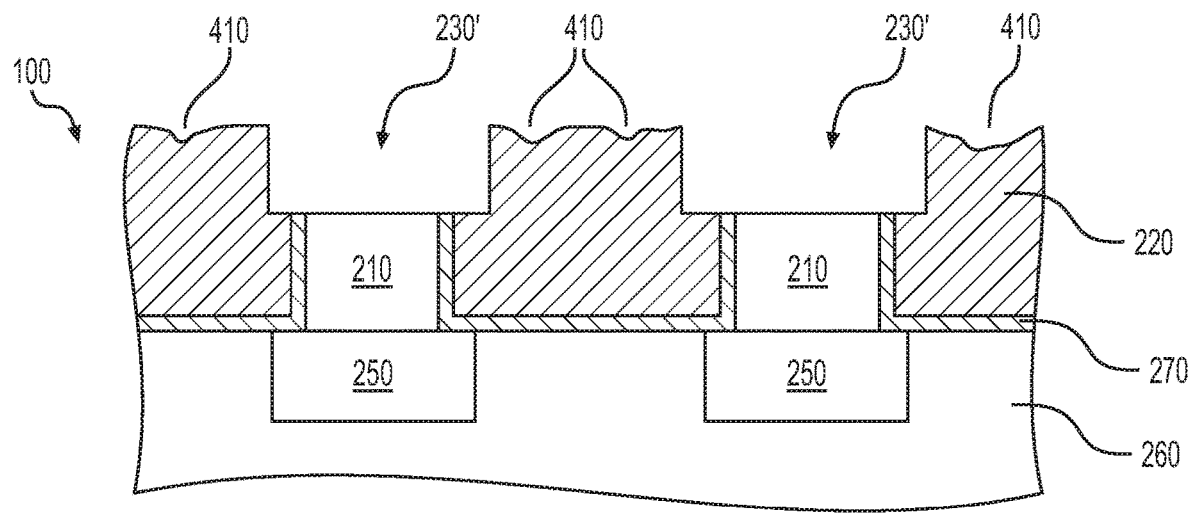

Cavities 230' may then be etched through the first ILD 220 to expose the top surface of the magnetoresistive devices 210 (step 530). FIG. 4E is a schematic illustration of cavities 230' etched through the first ILD 220. Any known process (or processes) may be used to etch the cavities 230'. Although not a requirement, in some embodiments, an etching process, such as, for example, reactive ion beam etching (RIE) or ion beam etching (IBE) may be used to etch the cavities 230'. During RIE or IBE, the momentum of accelerated ions (reactive ions in the case of RIE) ablades the first ILD 220 and creates cavities 230'. However, the use of RIE or IBE to form the cavities 230' is not a requirement. The cavities 230' may be formed by any known method (wet etching, dry etching, etc.). In some embodiments, surfaces of the first ILD 220 except where cavities 230' are desired may be masked to form the cavities 230' at the desired locations.

Figure 4F:
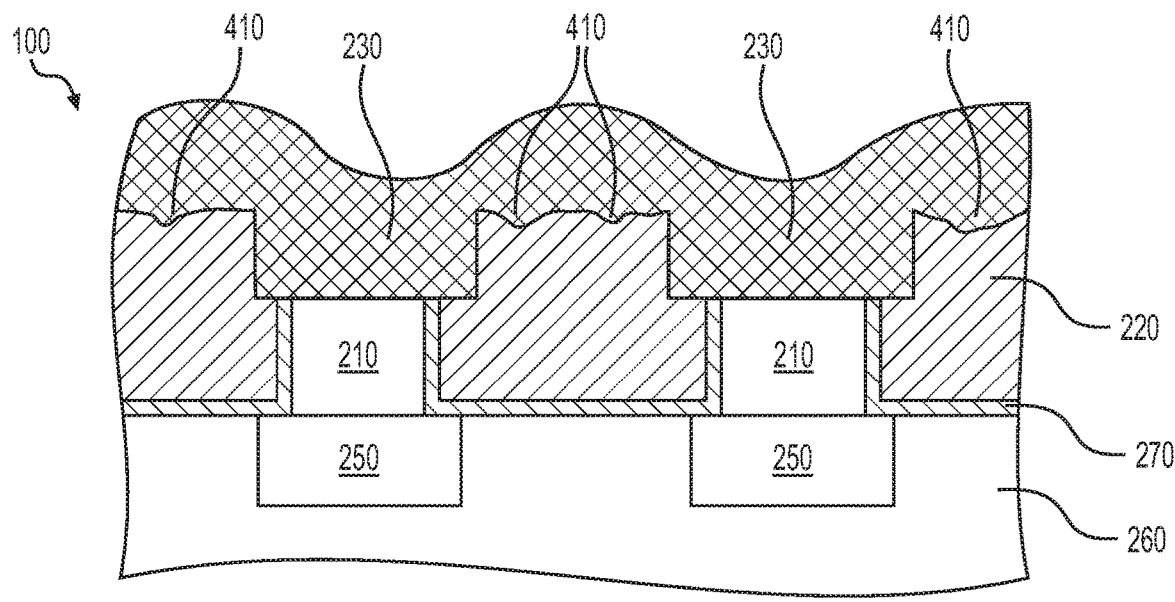

An electrically conductive material (e.g., copper) may then be deposited on the top surface of the IC device 100 to fill the cavities 230', thereby forming the vias 230 (step 535). FIG. 4F is a schematic illustration of the IC device 100 of FIG. 4E with an electrically conductive material deposited on its top surface. Any suitable material deposition process (chemical vapor deposition, physical vapor deposition, sputter, etc.) may be used to deposit the conductive material. As those of ordinary skill in the art will readily recognize, any suitable electrically conductive material may be deposited into cavities 230'. As illustrated in FIG. 4F, in some embodiments, the conductive material may first be deposited on substantially the entire top surface of the magnetoresistive device 210 (e.g., as a conformal coating) as well as over areas adjacent magnetoresistive device 210.

Figure 4G:
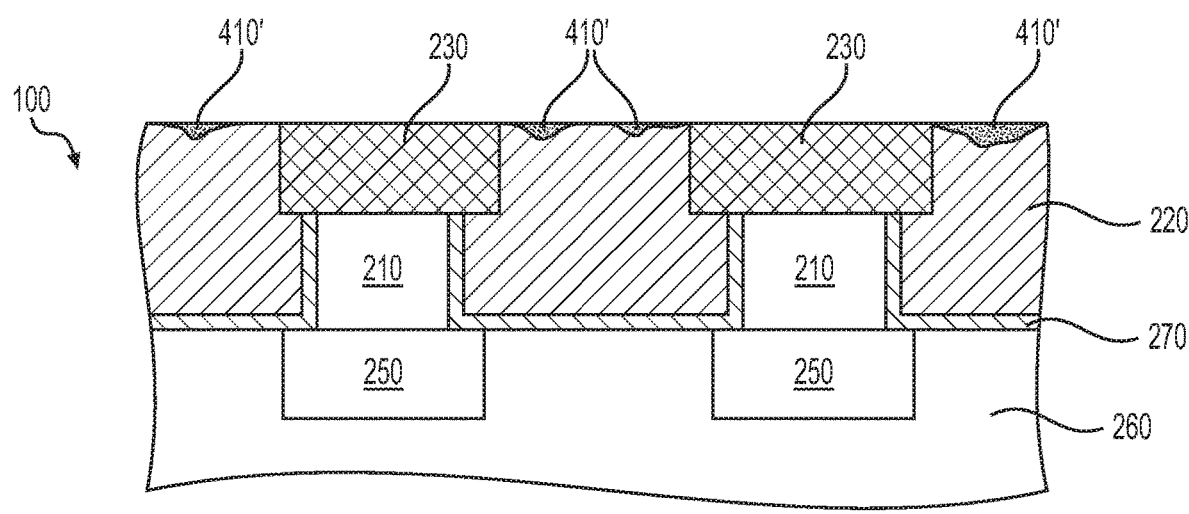

The top surface of the IC device 100 may then be polished to remove the electrical conductive material from all surfaces outside the cavities 230' (step 540). FIG. 4G is an illustration of the IC device 100 with the conductive material filling the cavities 230' to form the vias 230. It should be noted that the above-described via filling process is merely exemplary. In some embodiments, the vias 230 may be formed in the etched cavities 230' by other known techniques. In some cases, as shown in FIG. 4F, during the deposition process, the deposited conductive material may also fill the pits 410 formed on the first ILD 220 (during polishing) and form pockets or slivers 410' of electrically conductive areas, as shown in FIG. 4G. In some cases, these slivers 410' may cause electrical bridging between adjacent magnetoresistive devices 210 and result in electrical shorts. Thus, the pits 410 formed as a result of directly polishing a low-k ILD material may cause electrical shorts between memory cells in the memory portion 120 (and between conductors in the adjacent logic portion 110) of the IC device 100.

Figure 6A:
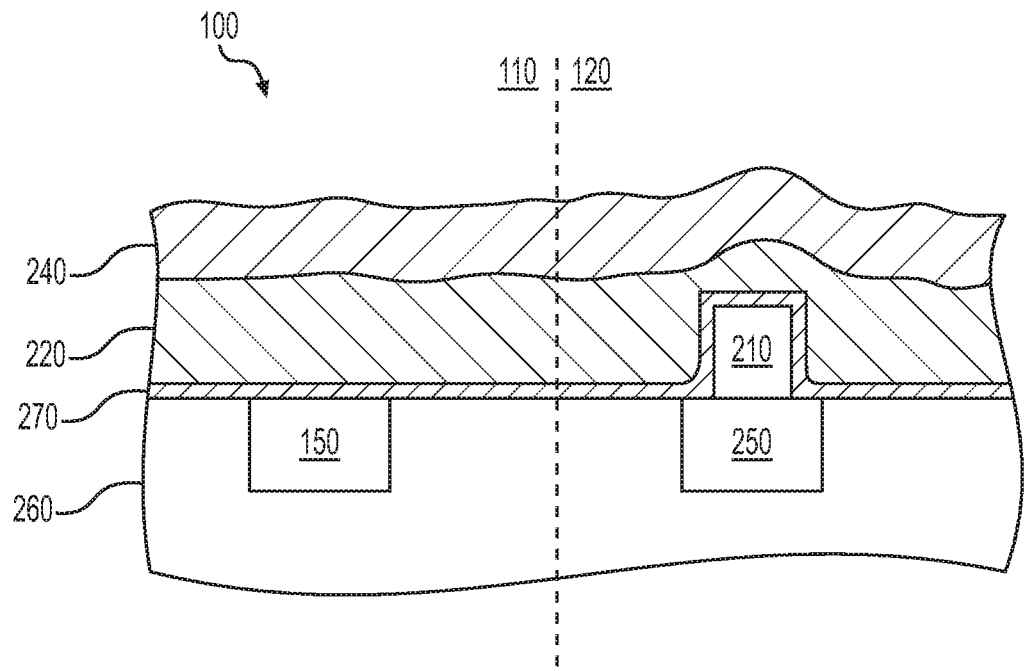

To alleviate or minimize the above-described electrical shorting issue, in some embodiments of the current disclosure, different configurations of the interlayer dielectric may be used. FIGS. 6A-6F are schematic cross-sectional illustrations of the exemplary IC device 100 of the current disclosure during different stages of another exemplary fabrication process. FIG. 8 is a flowchart that illustrates the exemplary fabrication process represented in FIGS. 6A-6F. In the description below, reference will be made to both FIGS. 6A-6F and FIG. 8. Magnetoresistive devices 210 may first be formed on the bottom contacts 250 of the semiconductor substrate 260 (step 810), and the formed magnetoresistive devices 210 may be coated with the first encapsulant 270 (step 815), as described above with reference to steps 510 and 515 of FIG. 5 (and FIGS. 4A and 4B). The first ILD 220 may then be deposited over the coated magnetoresistive devices 210 (step 820), as described above with reference to step 520 of FIG. 5 (and FIG. 4C). As explained previously, in some embodiments, the first ILD 220 may include a low-k dielectric material (e.g., with a dielectric constant which is less than or equal to 3.5, and preferably less than or equal to 3.0, with porosity of approximately 30-39%). In some embodiments, in anticipation of the deposition of a second ILD 240 discussed below, a thickness of the first ILD 220 may be relatively smaller than a conventional thickness of an ILD layer when only a single ILD (e.g., first ILD 220) is contemplated. A second ILD 240 then may be deposited over the first ILD 220 across the entire field covering both the logic portion 110 and the memory portion 120 of the IC device 100 (step 825). As alluded to above, a thickness of the second ILD 240 layer may be relatively greater than the thickness of the first ILD 220 layer. FIG. 6A is a schematic illustrating an IC device 100 with two layers of differing dielectric materials (i.e., first ILD 220 and second ILD 240) sequentially deposited over the coated magnetoresistive device 210 in one exemplary embodiment. As previously explained, the second ILD 240 may include a conventional ILD material or any dielectric material having a higher dielectric constant than the first ILD 220. In some embodiments, the second ILD 240 may include a dielectric material that has a higher dielectric constant and is relatively denser (e.g., having a density of approximately 0.7-2 gm/mL) than the first ILD 220. In some embodiments, the second ILD 240 may be approximately 5 to 10 times denser than the first ILD 220. Moreover, in the embodiments, of FIGS. 6A-9G, the combined thickness of the first ILD 220 and second ILD 240 layers may be approximately equal to the thickness of ILD 220 layer of FIGS. 4A-4G.

Forming the bi-material dielectric region spanning the vertical space V1 may result in electrical performance improvements (e.g., lower RC delay), while also enabling polishing of the bi-material dielectric region without inducing defects in the first ILD 220. For example, as explained previously, polishing (such as, for example, by CMP) a low-k ILD material may induce defects (such as pits, excessive material removal, etc.) that can trap material during subsequent processing operations (e.g., deposition of an electrically conductive material), and cause performance issues. Covering or coating the mechanically weaker low-k ILD (e.g., first ILD 220) with a relatively tougher conventional ILD material (e.g., second ILD 240) enables electrical performance benefits to be realized while allowing the bi-material dielectric region to be processed (e.g., polished) without causing processing-related issues in the IC device 100.

Figure 6B:
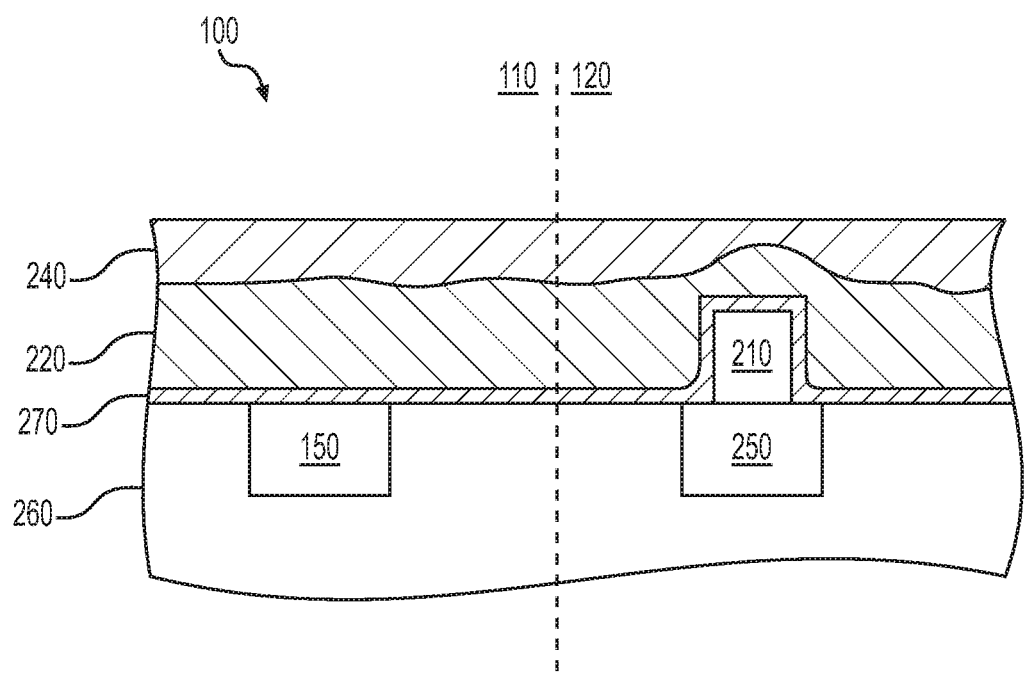

The exposed surface of the deposited second ILD 240 may then be planarized, for example, by polishing (step 830). FIG. 6B is a schematic illustration of the IC device 100 with the exposed surface of the second ILD 240 planarized. Any known process may be used to planarize the surface of the second ILD 240. Planarizing the second ILD 240 may prepare the surface for subsequent operations such as photolithography and etching to create a via opening. In some embodiments, a technique, such as, for example, chemical mechanical polishing (CMP) may be used to planarize the second ILD 240. Since CMP processes are known in the art, they are not described herein. As shown in FIG. 6A, because of the magnetoresistive devices 210 projecting from the surface of the substrate 260, the deposited first and second ILDs 220, 240 (deposited in steps 820 and 825) over the magnetoresistive devices 210 may have bumps or "steps." During planarization or polishing (e.g., step 830), the "steps" in the second ILD 240 layer over the magnetoresistive device 210 may be removed until the top surface of the second ILD 240 spanning both the memory portion 120 and the logic portion 110 is flat, level, and/or smooth, or substantially flat, level, and/or smooth (see FIG. 6B). Notably, after the polishing (step 830) is complete, a portion of the second ILD 240 may remain over the "steps" in the first ILD 220 layer above the magnetoresistive devices 210. To achieve this structure, polishing may be applied to the second ILD 240 layer and halted after the "steps" in the second ILD 240 layer are removed but before the top surface of the "steps" in the first ILD 220 layer is exposed, leaving a thin layer of the second ILD 240 over the "steps" in the first ILD 220 layer. By polishing only the second ILD 240 (which is made of a mechanically tougher material) that is applied over the first ILD 220, the polished surface will be free of pits, which would have occurred if the polishing were applied directly to the first ILD 220. In other embodiments, however, the polishing step may remove substantially all of second ILD 240, as explained in greater detail below.

FIG. 7A illustrates an alternative embodiment of the planarization process (step 830) described with reference to FIG. 6B. In this alternative embodiment, after depositing the second ILD 240 (step 825) as shown in FIG. 6A, the surface of the second ILD 240 may be planarized to remove portions of the second ILD 240 (step 830), by for example, CMP or another suitable process. In this embodiment, however, planarization of the second ILD 240 layer is only halted at the moment the top surface of the "steps" in the first ILD 220 layer is exposed or just before portions of the first ILD 220 is exposed. Because the top surface of the "step" in the first ILD 220 layer is barely polished or ground minimally, the exposed top surface of the first ILD 220 layer will be free of any appreciable quantity of pits or other surface irregularities.

FIG. 7B illustrates another alternative embodiment of the planarization process (step 830) described above with respect to FIG. 6B. In this embodiment, after depositing the second ILD 240 (step 825) as shown in FIG. 6A, the surface of the second ILD 240 may be planarized as described above by using any known polishing technique (step 830). In this embodiment, as shown in FIG. 7B, during the planarization process, a portion of the "steps" in the first ILD 220 layer above the magnetoresistive device 210 may also be removed. That is, planarization or polishing of the second ILD 240 may be continued until the "steps" in the second ILD 240 are removed and a portion of the "steps" in the first ILD 220 are removed. That is, polishing or planarizing may be halted just after an initial portion of first ILD 220 is removed but prior to a substantial quantity of first ILD is removed. In some embodiments, during this step a substantial portion (or most) of the second ILD 240 from areas adjacent the magnetoresistive devices 210 may also be removed. However, a sufficient thickness of the second ILD 240 remains in the areas adjacent the magnetoresistive devices 210 after polishing to prevent exposure of the first ILD 220 in these areas (i.e., areas adjacent the magnetoresistive devices 210). Notably, polishing may be applied to the second ILD 240 layer and to the "steps" in the first ILD 220 layer until only a sufficient thickness of the second ILD 240 layer remains in the areas adjacent the magnetoresistive devices 210. Even though this embodiment may result in pits 410 on the exposed surface of the first ILD 220 layer above the magnetoresistive devices 210 (see FIG. 7B), the second ILD 240 layer of a sufficient thickness remaining over the areas adjacent the magnetoresistive devices 210 will prevent pits in these areas (e.g., the areas adjacent the magnetoresistive devices 210). The pits 410 formed over the magnetoresistive devices 210 may be removed (e.g., etched away) when cavities are formed through the ILD layers over the magnetoresistive devices 210 to form vias.

Figure 6C:
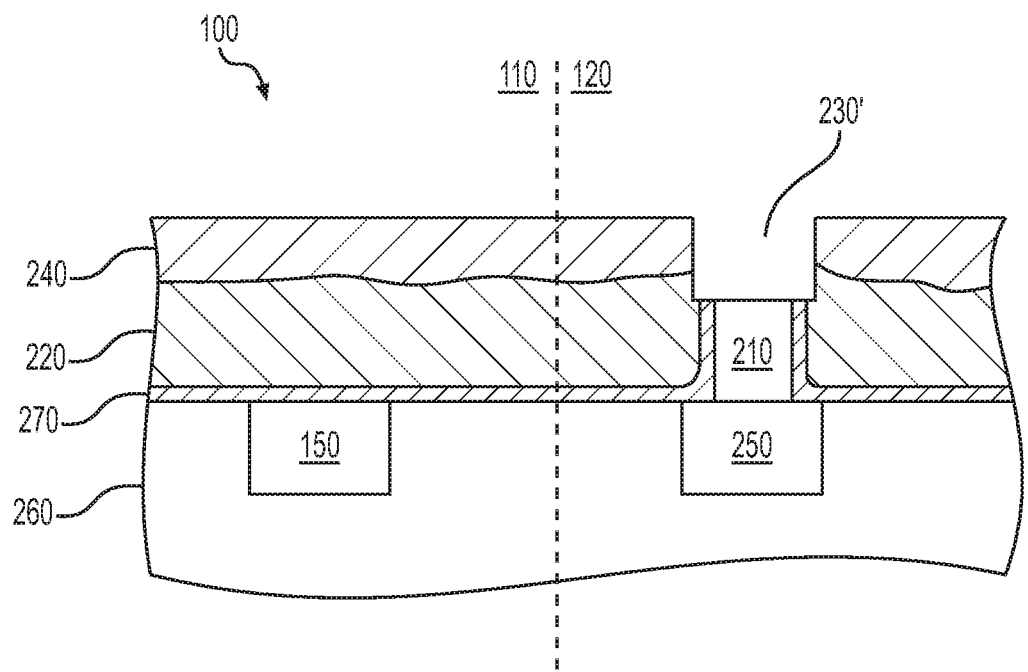

With reference now to FIG. 6C, cavities 230' may then be etched through the dielectric materials over the magnetoresistive devices 210 to expose the top surface of the magnetoresistive devices 210 (step 835). In this step, the second ILD 240, the first ILD 220, and the encapsulation layer 270 over the magnetoresistive devices 210 may be removed by etching. In some embodiments (e.g., where a planarization process as described with reference to FIG. 7B is utilized), the cavities 230' may be formed wide enough to remove the pits 410 formed during the planarization process. FIG. 6C is a schematic illustration of cavities 230' etched through the second ILD 240, the first ILD 220, and the encapsulation layer 270. As discussed above with reference to step 530 of FIG. 5 and FIG. 4E, any known process (e.g., RIE, IBE, etc.) may be used to etch the cavities 230'. In some embodiments, surfaces of the second ILD 240 except where cavities 230' are desired may be masked to form the cavities 230' at the desired locations. In some embodiments, the chemistry of the etchant may be selected to achieve a desired selectivity to the etched materials (second ILD 240, first ILD 220, encapsulation layer 270, etc.). For example, the etchant chemistry may be selected to achieve a selectivity of approximately 1:1 (or any other desired ratio) for the second ILD 240 and the first ILD 220. In some embodiments, the etchant chemistry may be adjusted during the etching process to achieve a desired selectivity for a material. For example, in some embodiments, during the initial stages of the etching process, the etchant chemistry may be adjusted to be more selective to the second ILD 240. After a while (e.g., after the second ILD 240 is removed or substantially removed), the chemistry of the etchant may be adjusted to be more selective to the first ILD 220 until the first ILD 220 is completely removed (or substantially removed). The etchant chemistry may then be adjusted to be selective to the encapsulation layer 270 to remove the encapsulation layer 270 so as to expose the top of the magnetoresistive device 210.

Figure 6D:
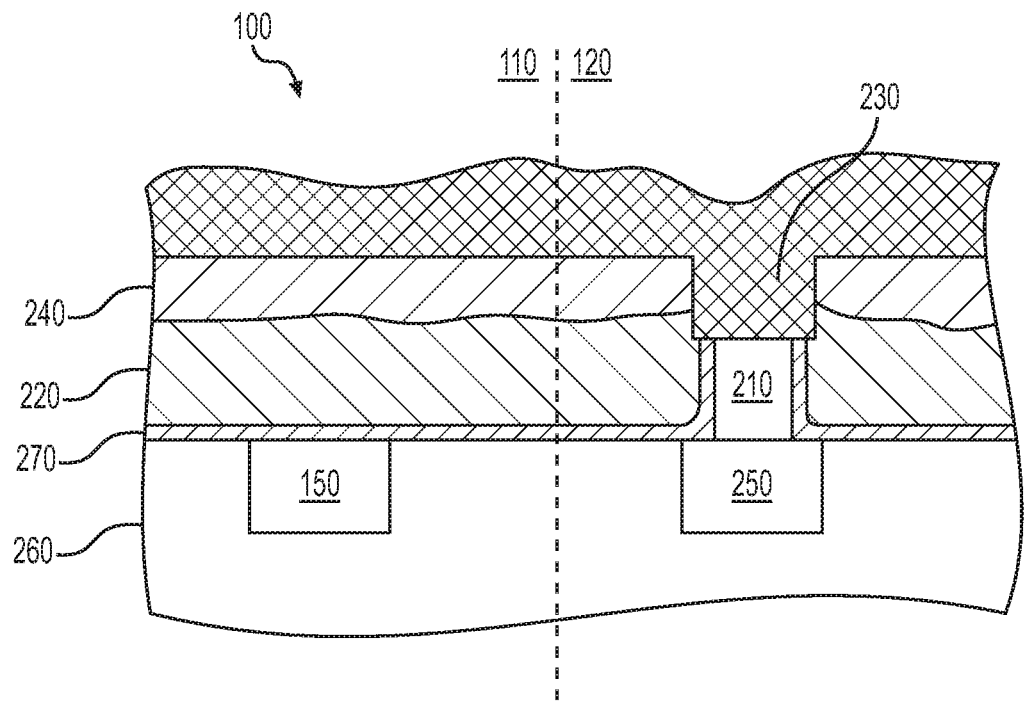
Figure 6E:
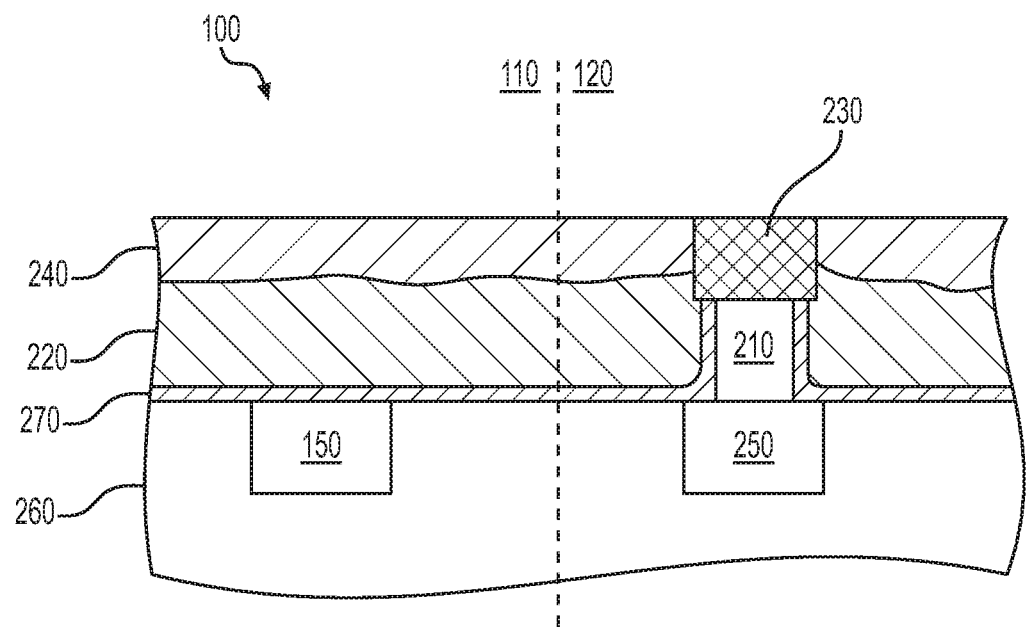

An electrically conductive material may then be deposited on the top surface of the IC device 100 to fill the cavities 230' and form the vias 230 (step 840). FIG. 6D is a schematic illustration of the IC device 100 of FIG. 6C with an electrically conductive material deposited on its top surface. As discussed above with reference to step 535 of FIG. 5 and FIG. 4F, any suitable material deposition process (chemical vapor deposition, physical vapor deposition, sputter, etc.) may be used to deposit the electrically conductive material, and any suitable electrically conductive material may be deposited using this process. As illustrated in FIG. 6D, in some embodiments, the electrically conductive material may first be deposited on substantially the entire top surface of the IC device 100 (e.g., as a conformal coating). The top surface of the IC device 100 may then be polished to remove the electrically conductive material from all surfaces outside the cavities 230' (step 845). FIG. 6E is an illustration of the IC device 100 with the electrically conductive material filling the cavities 230' to form the vias 230.

Figure 6F:
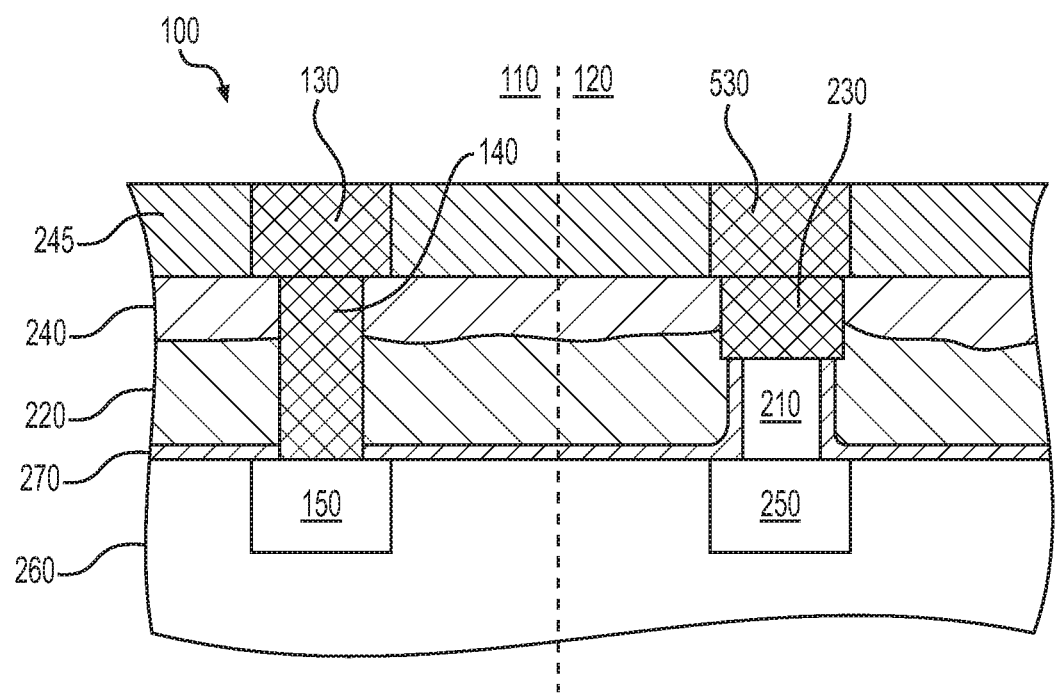

After polishing the top of the IC device 100 as shown in FIG. 6E, a third ILD 245 may be deposited over the planarized surface (step 850). In some embodiments, as illustrated in FIG. 6F, the third ILD 245 may be deposited over both the magnetic portion 120 and the logic portion 110 (e.g., across substantially the entire field) of the IC device 100. In general, the third ILD 245 may be any dielectric material. In some embodiments, the third ILD 245 may include a conventional ILD dielectric material (e.g., TEOS, silicon dioxide ($S_tO_2$), silicon nitride, etc.) or a low-k dielectric material (e.g., flourine-doped silicon dioxide or silicas, carbon-doped silicon dioxide or silicas (e.g., SiCOH), porous silicon dioxide, spin-on organic polymeric dielectrics, spin-on silicon based polymeric dielectric SiCOH, etc.). However, as previously explained, for better electrical performance (e.g., lower RC delay, etc.) of IC device 100, it may be desirable to use a low-k dielectric material as the third ILD 245. In some embodiments, the third ILD 245 may include the same low-k dielectric material as the first ILD 220.

Cavities may then be etched through the third ILD 245 to expose the via 230 at the memory portion 120 (step 855). In some embodiments, during the etching process, cavities may also be etched in logic portion 110 of the IC device 100. Notably, in the logic portion 110, cavities may first be etched through the third ILD 245 to expose the second ILD 240 ("first cavities"), then additional cavities may be etched through the second ILD 240 and the first ILD 220 to expose a portion of the top surface of the bottom contact 150 ("second cavities"). Notably, the width of the first cavities may be wider than that of the second cavities. Alternatively, the second cavities may be formed immediately after planarizing the top of the IC device 100 in step 845 of FIG. 8 and FIG. 6E, and before depositing the third ILD 245 in step 850 of FIG. 8. In such a case, during the deposition of the third ILD 245 as described in step 850 of FIG. 8, some of the third ILD 245 may partially deposit in the second cavities. Therefore, in some embodiments, after etching the first cavities through the third ILD 245 to expose the earlier-formed second cavities, any deposited third ILD 245 material in the second cavities may be cleaned or otherwise removed by using suitable processes, for example, angled etch, isotropic etch, etc. After this cleaning or removal process, cavities formed at the logic portion 110 may extend vertically from top of the IC device 100 to the top surface of the bottom contact 150. However, as discussed above, the width of the first cavities (e.g., the width of the cavities formed in the third ILD 245) may be wider than the width of the second cavities (e.g., the width of the cavities formed in the first ILD 220 and the second ILD 240). Any known process (RIE, IBE, etc.) may be used to form the cavities. Further, as discussed above with reference to step 835 of FIG. 8 and FIG. 6C, surfaces of the third ILD 245 and the second ILD 240 except where cavities are desired may be masked to form the cavities at the desired locations, and the chemistry of the etchant may be selected to achieve a desired selectivity to the etched materials (third ILD 245, second ILD 240, first ILD 220, encapsulation layer 270, etc.). Consistent with one or more of the previously described steps, the etched cavities may then be filled with an electrically conductive material (step 860). In some embodiments, as described with reference to step 535 of FIG. 5 (and illustrated in FIG. 4F), the electrically conductive material may be deposited over the entire top surface of the IC device 100 to fill the cavities. As described with reference to step 540 of FIG. 5 (and illustrated in FIG. 4G), the top surface of the IC device 100 may then be polished to remove the electrical conductive material from all surfaces outside the cavities and form top contacts 130 and 530, and vias 140 (step 865). FIG. 6F is an illustration of the IC device 100 after polishing, with the conductive material filling the cavities to form the top contacts 130 and 530, and vias 140.

Figure 9A:
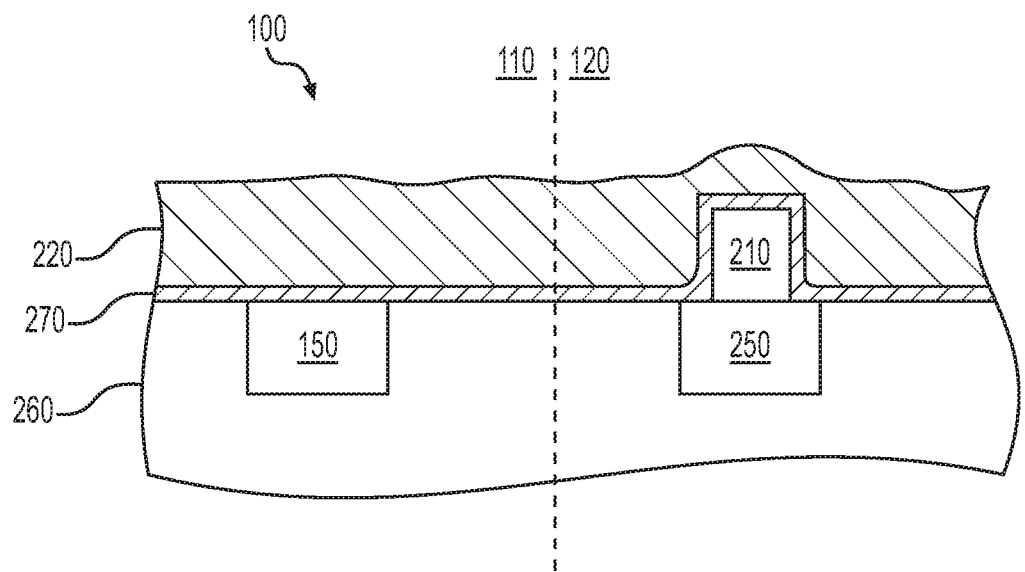

FIGS. 9A-9G are schematic cross-sectional illustrations of an exemplary IC device 100 of the current disclosure at different stages of another exemplary manufacturing process. FIG. 10 is a flowchart that illustrates the exemplary manufacturing process represented in FIGS. 9A-9G. In the description below, reference will be made to both FIGS. 9A-9G and FIG. 10. After forming the magnetoresistive device 210 on a bottom contact 250 (step 1010) and coating the IC device 100 using the first encapsulant 270 (step 1015) following, for example, the same processes described with reference to steps 510 and 515 of FIG. 5 (and illustrated in FIGS. 4A and 4B), the first ILD 220 may be deposited to cover the coated magnetoresistive devices 210 (step 1020). FIG. 9A is a schematic illustration of the coated IC device 100 covered by the first ILD 220. As explained above with respect to FIG. 4C, any suitable process (e.g., CVD, ALD, etc.) may be used to deposit the first ILD 220. As explained previously, in some embodiments, the first ILD 220 may include a low-k dielectric material (e.g., a dielectric constant which is less than or equal to about 3.5, and preferably less than or equal to about 3.0, with porosity about 30-39%).

Figure 9B:
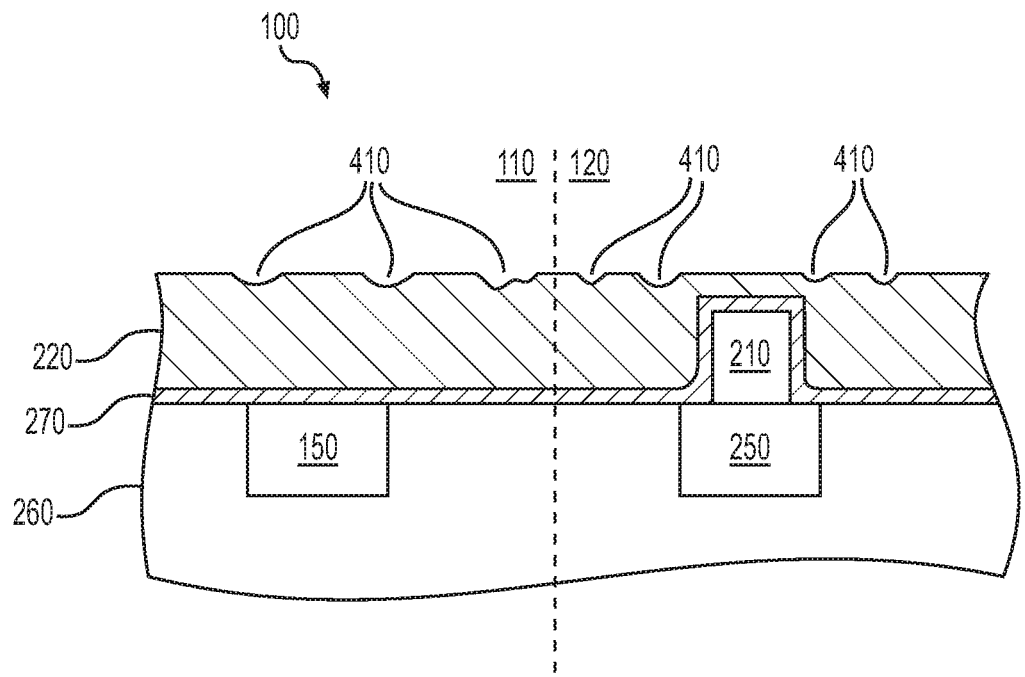

The exposed surface of the deposited first ILD 220 may then be planarized (step 1025). FIG. 9B is a schematic illustration of the IC device 100 with the exposed surface of the first ILD 220 planarized. As explained above with reference to step 525 of FIG. 5 (and illustrated in FIG. 4D), any known process may be used to planarize the surface of the first ILD 220, including but not limited to chemical mechanical polishing (CMP). Planarizing the first ILD 220 may prepare the surface for subsequent operations such as photolithography and etching to create a via opening. In some embodiments, as shown in FIG. 9B, the polishing process may create pits 410 on the low-k first ILD 220.

Figure 9C:
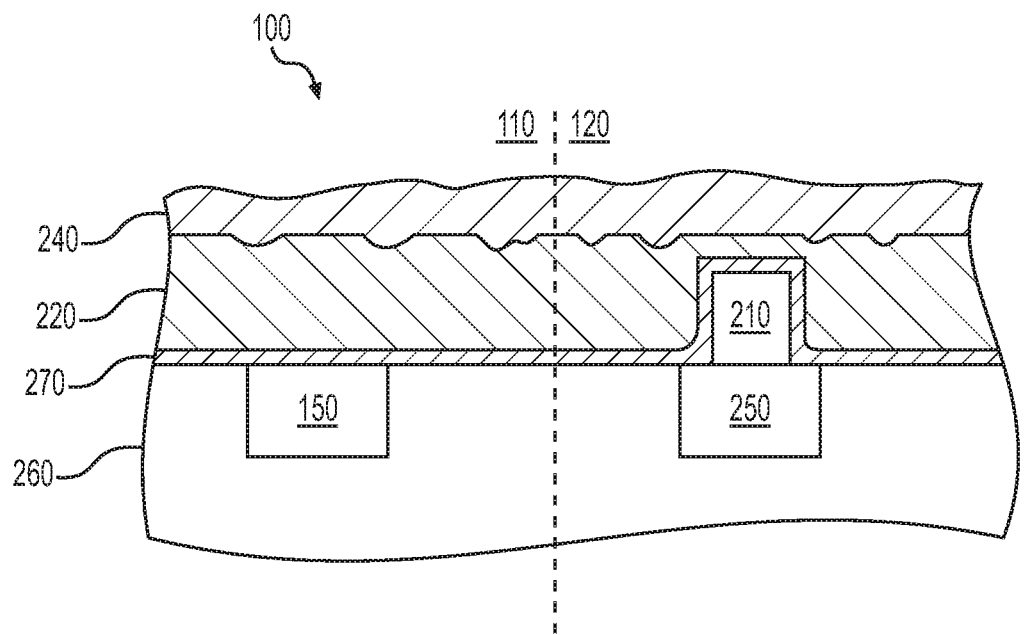

After planarizing the first ILD 220 (step 1025), a second ILD 240 may be deposited over the planarized surface of the first ILD 220 (step 1030). FIG. 9C is a schematic illustration of the IC device 100 with two layers of differing dielectric materials (i.e., first ILD 220 and second ILD 240) sequentially deposited over the coated magnetoresistive device 210 in one exemplary embodiment. As explained previously, the second ILD 240 may include a conventional ILD material or any dielectric material having a higher dielectric constant than the first ILD 220. In some embodiments, the second ILD 240 may include a dielectric material that is relatively denser (e.g., having a density of, e.g., 0.7-2 gm/mL) than the first ILD 220. In some embodiments, the second ILD 240 may be 5 to 10 times relatively denser than the first ILD 220.

Figure 9D:
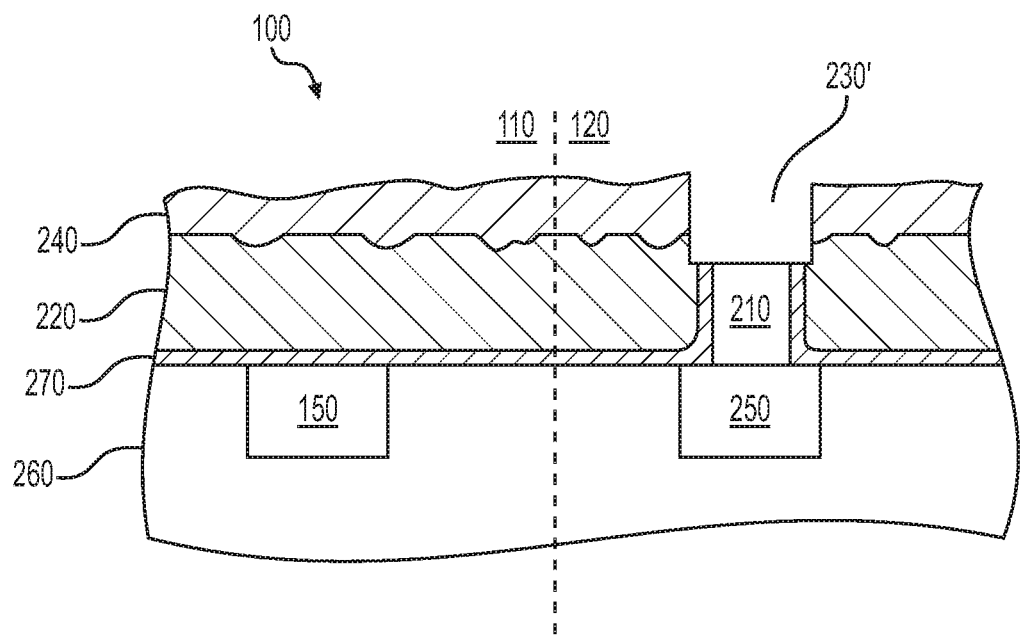
Figure 9E:
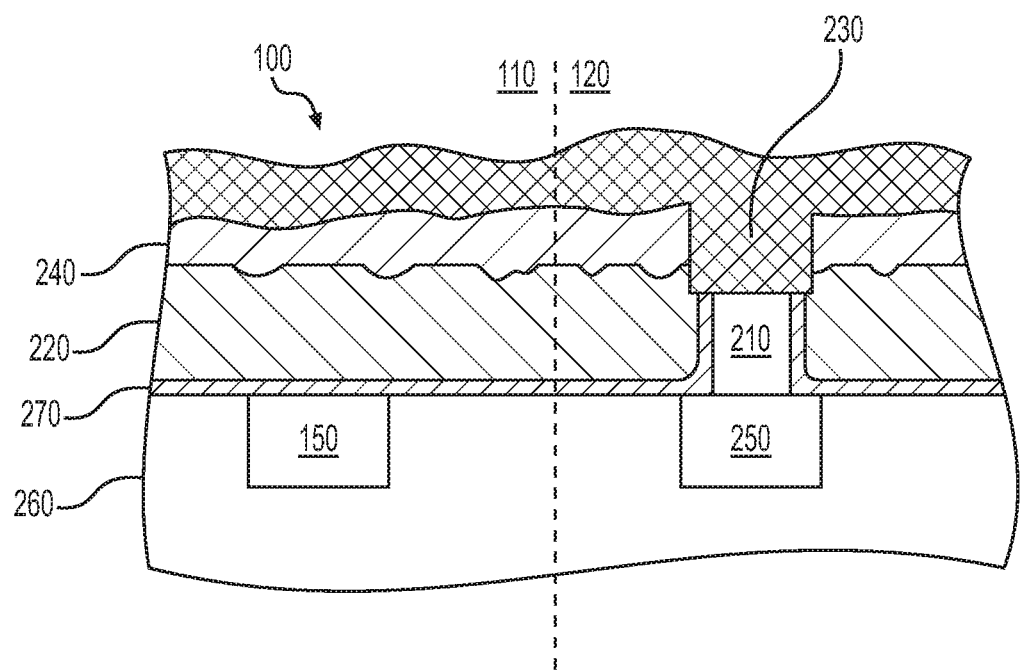
Figure 9F:
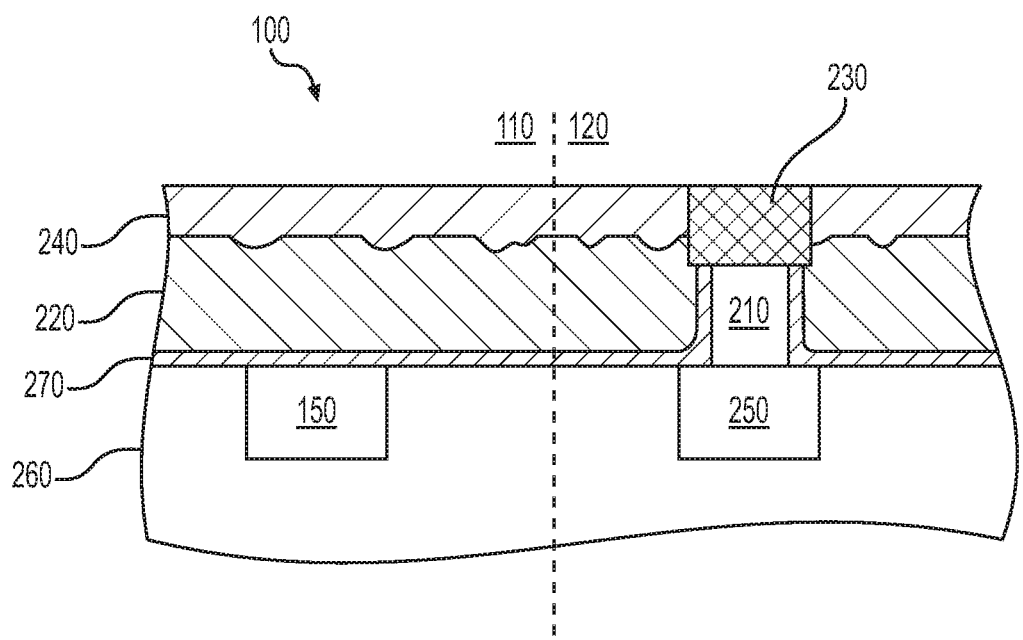

In a manner similar to that described above, cavities 230' may then be etched through the second ILD 240, the first ILD 220, and/or the encapsulation layer 270 (simultaneously or sequentially) to expose the top surface of the magnetoresistive devices 210 (step 1035). FIG. 9D is a schematic illustration of cavities 230' etched through the second ILD 240, the first ILD 220, and the encapsulation layer 270. As discussed above with reference to step 530 (see FIG. 4E), any known process (RIE, IBE, etc.) may be used to etch the cavities 230'. An electrically conductive material may then be deposited on the top surface of the IC device 100 to fill the cavities 230' and form the vias 230 (step 1040). FIG. 9E is a schematic illustration of the IC device 100 of FIG. 9D with an electrically conductive material deposited on its top surface. In some embodiments, as illustrated in FIG. 9E, the electrically conductive material may first be deposited on substantially the entire top surface of the IC device 100 (e.g., as a conformal coating), and the top surface may then be polished to remove the electrical conductive material from surfaces outside the cavities 230' (step 1045). FIG. 9F is an illustration of the IC device 100 after polishing, with the electrically conductive material filling only cavities 230' to form vias 230.

Figure 9G:
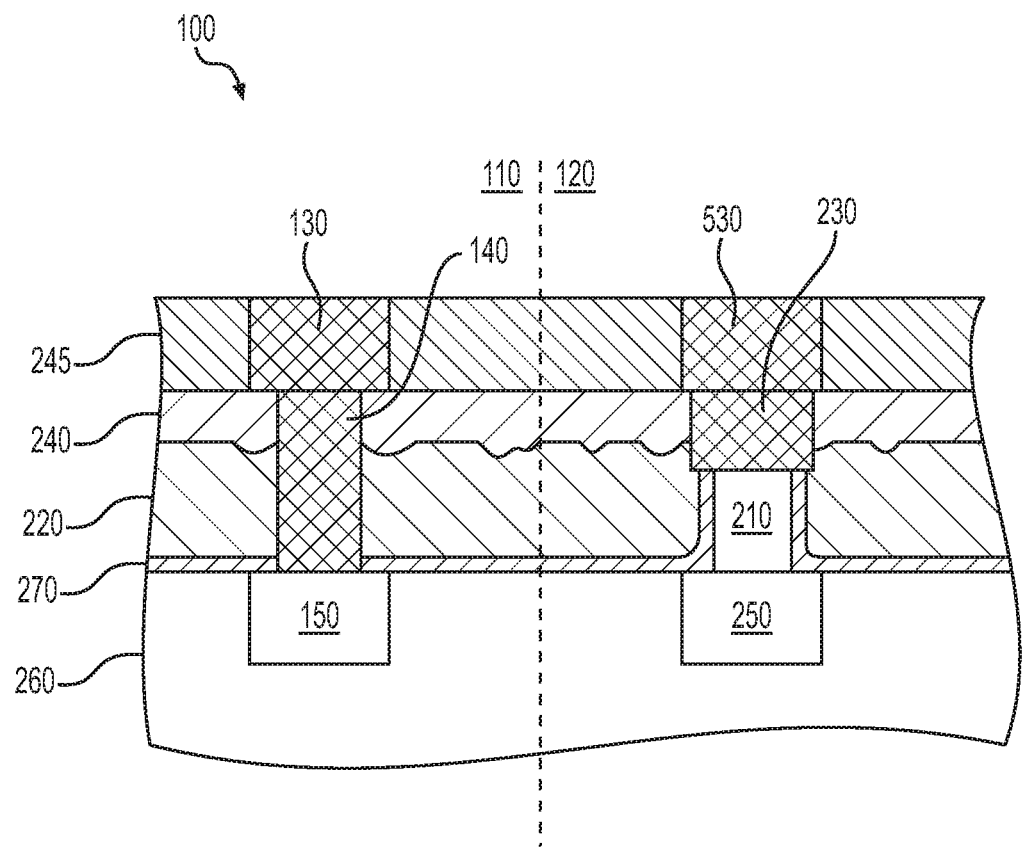

After polishing the top of the IC device 100 as shown in FIG. 9F, a third ILD 245 may be deposited over the planarized surface across the entire field of the IC device 100 (step 1050). As explained previously, in some embodiments, the third ILD 245 may include the same material as the first ILD 220, or any other suitable dielectric material. Cavities may then be etched through the third ILD 245 to expose the via 230 at the memory portion 120 (step 1055). In some embodiments, cavities may also be etched in the logic portion 110 of the IC device 100 in this step. Notably, in the logic portion 110, cavities may first be etched through the third ILD 245 to expose the second ILD 240 ("first cavities"), then additional cavities may be etched through the second ILD 240 and the first ILD 220 to expose a portion of the top surface of the bottom contact 150 ("second cavities"). Notably, the width of the first cavities may be wider than that of the second cavities. Alternatively, the second cavities may be formed immediately after planarizing the top of the IC device 100 in step 1045 of FIG. 10 and FIG. 9F, and before depositing the third ILD 245 in step 1050 of FIG. 10. In such a case, during the deposition of the third ILD 245 as described in step 1050 of FIG. 10, some of the third ILD 245 may partially deposit in the second cavities. Therefore, in some embodiments, after etching the first cavities through the third ILD 245 to expose the earlier-formed second cavities, any deposited third ILD 245 material in the second cavities may be cleaned or otherwise removed by using suitable processes, for example, angled etch, isotropic etch, etc. After this cleaning or removal process, cavities formed at the logic portion 110 may extend vertically from top of the IC device 100 to the top surface of the bottom contact 150. However, as discussed above, the width of the first cavities (e.g., the width of the cavities formed in the third ILD 245) may be wider than the width of the second cavities (e.g., the width of the cavities formed in the first ILD 220 and the second ILD 240). As described with reference to steps 860 and 865 of FIG. 8, an electrically conductive material may then be deposited on the top surface of the IC device 100 to fill the cavities (step 1060), and the electrically conductive material may be removed from surfaces outside the cavities to define top contacts 130 and 530, and vias 140 (step 1065). FIG. 9G is an illustration of the IC device 100 with the electrically conductive material filling the cavities to form the top contacts 130 and 530, and vias 140.

As alluded to above, the magnetoresistive devices (formed using the aforementioned-described techniques and/or processes) may include a sensor architecture or a memory architecture (among other architectures). For example, in a magnetoresistive device having a memory configuration, the magnetoresistive devices may be electrically connected to an access transistor and configured to couple or connect to various conductors, which may carry one or more control signals, as shown in FIG. 11. The magnetoresistive devices may be used in any suitable application, including, e.g., in a memory configuration. In such instances, the magnetoresistive devices may be formed as an IC device comprising a discrete memory device (See, e.g., FIG. 12A) or an embedded memory device having a logic therein (See, e.g., FIG. 12B), each including MRAM, which, in one embodiment is representative of one or more arrays of MRAM having a plurality of magnetoresistive devices formed magnetoresistive stacks/structures, according to certain aspects of certain embodiments disclosed herein.

Many modifications, variations, combinations and/or permutations are possible in light of the above teaching(s). For example, although certain exemplary techniques are described and/or illustrated above in the context of magnetoresistive devices (e.g., MTJ stacks), as noted above, the present inventions may be implemented in Giant Magnetoresistance (GMR) stacks of GMR-based magnetoresistive devices (for example, sensor and memory). Indeed, the present inventions may be implemented in conjunction with other memory cell structures including resistive RAM (Re-RAM or RRAM). For the sake of brevity, the discussions and illustrations will not be repeated specifically in the context of other memory cell structures—but such discussions and illustrations are to be interpreted as being entirely applicable to such memory cell structures.

For example, in one embodiment, after forming the MTJ stack, an encapsulation layer (comprising an insulating material (e.g., a silicon oxide or silicon nitride) is deposited to protect or isolate the MTJ stack from subsequent processing (for example, the integration processes to follow MTJ stack formation).

Subsequently, a first ILD 220 is deposited over the MTJ stack (or MTJ stacks of the memory cell array). In one embodiment, first ILD 220 comprises one or more materials having low K dielectric characteristics (a dielectric constant which is less than or equal to about 3.5, and preferably less than or equal to about 3.0). For example, first ILD 220 may comprise one or more of fluorine-doped silicon dioxide or silicas, carbon-doped silicon dioxide or silicas (e.g., SiCOH), porous silicon dioxide, spin-on organic polymeric dielectrics, spin-on silicon based polymeric dielectric SiCOH which is a material having a low or small dielectric constant relative to silicon dioxide or TEOS.

After deposition of first ILD 220 (for example, a low-k dielectric material with porosity of about 30-39%), a second interlayer dielectric (second ILD 240) is deposited over the MTJ stack (or MTJ stacks of the memory cell array). In one embodiment, second ILD 240 comprises one or more materials (for example, low temperature TEOS, silicon dioxide and silicon nitride) having more dense characteristics (e.g., a density of about 0.7-2 gm/mL) relative to the material of first ILD 220. That is, second ILD 240 has a greater density than first ILD 220—for example, in one embodiment second ILD 240 is about 5 to 10 times greater density than first ILD 220.

After deposition of second ILD 240, portions of second ILD 240 may be removed (for example, via a polishing technique such as chemical-mechanical planarization (CMP)). In this embodiment, the "step" or other surface irregularity in the layer of second ILD 240 is removed (or substantially removed) and the second ILD 240 surface is flat, level, and/or smooth (or substantially flat, level, and/or smooth). Notably, in this embodiment, a portion of second ILD 240 remains over the MTJ stack, as well as in the field areas adjacent the MTJ stack, after removal (for example, via CMP).

Subsequently, a via opening or window is formed (using, for example, conventional photolithography and etching techniques) to expose the MTJ stack to facilitate providing electrical contact the MTJ stack (which may or may not include a top electrically conductive electrode). Here, a mask is employed to pattern the ILD structure thereby removing selective portions of first ILD 220 and second ILD 240 (and encapsulation layer (which may be an insulating material)) which exposes the MTJ stack and permits contact (through an electrical conductive material (e.g., a metal) via) to the MTJ stack (for example, an electrically conductive top electrode of the stack). For example, after forming the via opening or window in the plurality of ILD layers, an electrically conductive material is deposited in the via opening or window and on the MTJ stack (for example, the exposed electrically conductive electrode of the MTJ stack). Thereafter, portions of the electrically conductive material are removed (for example, via a polishing technique such as CMP) to form the via. Here, the electrically conductive via provides connection between the MTJ stack and, for example, sense, read and/or write conductors.

In another embodiment, after deposition of second ILD 240, portions of second ILD 240 and first ILD 220 may be removed (for example, via a polishing technique such as chemical-mechanical planarization (CMP)). That is, in addition to removing the "step" in the layer of second ILD 240, in this embodiment portions of first ILD 220 that overlay the MTJ stack may or may not be removed wherein the surface is leveled and/or smoothed. Notably, in this embodiment, portions of second ILD 240 are partially removed (for example, via CMP) from the field area or regions (relative to the MTJ stack) whereas no second ILD 240 remains over the MTJ stack after polishing. In this embodiment, a substantial or significant portion of second ILD 240 remains in the field areas or regions after polishing.

In another embodiment, most of the second ILD 240 is removed in the field areas or regions via polishing albeit a sufficient thickness of second ILD 240 material remains in the field areas or regions after polishing such that during processing to form the via(s), the thickness of second ILD 240 in the field areas or region is sufficiently thick to prevent formation of pits which cause shorts between memory cells in the memory array and/or conductors in the adjacent logic area of the integrated circuit (IC) during/after deposition of the electrically conductive material of the via formation process.

Notably, subsequent processing to form the via in the via opening or window may be the same as described above with respect to the embodiment illustrated in. For the sake of brevity, that discussion will not be repeated.

In yet another embodiment, a first ILD 220 layer is deposited over the MTJ stack (or MTJ stacks of the memory cell array). Here again, in one embodiment, first ILD 220 comprises one or more materials having low K dielectric characteristics (a dielectric constant which is less than or equal to about 3.5, and preferably less than or equal to about 3.0). For example, first ILD 220 may comprise one or more of fluorine-doped silicon dioxide or silicas, carbon-doped silicon dioxide or silicas (e.g., SiCOH), porous silicon dioxide, spin-on organic polymeric dielectrics, spin-on silicon based polymeric dielectric SiCOH which is a material having a low or small dielectric constant relative to silicon dioxide or TEOS. In one embodiment, first ILD 220 is a low-k dielectric material with porosity of about 30-39%.

After deposition of first ILD 220 (for example, a low-k dielectric material with porosity of about 30-39%), second ILD 240 is deposited over the MTJ stack (or MTJ stacks of the memory cell array).

After deposition of first ILD 220 and prior to deposition of second ILD 240, portions of first ILD 220 are removed (for example, via a polishing technique such as CMP). In this embodiment, the "step" of first ILD 220 may be removed (or substantially removed) and the first ILD 220 surface is flat, level and/or smooth (or substantially flat, level and/or smooth). Notably, in this embodiment, a portion of first ILD 220 remains over the MTJ stack and field regions after removal (for example, via CMP).

After depositing and processing first ILD 220, second ILD 240 is deposited over the MTJ stack (or MTJ stacks of the memory cell array). In one embodiment, second ILD 240 comprises one or more materials having more dense characteristics (for example, a density of about 0.7-2 gm/mL) relative to the material of first ILD 220. That is, second ILD 240 has a greater density than first ILD 220—for example, in one embodiment second ILD 240 is about 5 to 10 times greater density than first ILD 220. In one embodiment, second ILD 240 comprises one or more materials (for example, low temperature TEOS, silicon dioxide and silicon nitride).

Like that described above, a via opening or window is then formed (using, for example, conventional photolithography and etching techniques) to contact the MTJ stack (which may or may not include a top electrically conductive electrode. Here, a mask is employed to pattern the ILD structure thereby removing selective portions of first ILD 220 and second ILD 240 (and encapsulation layer (which may be an insulating material)) to expose the MTJ stack and thereby facilitate electrical contact (through a metal or conductive via) to the MTJ stack (for example, an electrically conductive top electrode. For example, after forming the via opening or window in the plurality of ILD layers, an electrically conductive material is deposited in the via opening or window to contact the exposed electrically conductive electrode of the MTJ stack. Thereafter portions of the electrically conductive material removed (for example, via a polishing technique such as CMP) to form the via. The electrically conductive via provides connection between the MTJ stack and, for example, sense, read and/or write conductors.

In addition to the deposition and processing described in the memory array area, first ILD 220 is also deposited in the logic area, as described above. Moreover, after deposition of first ILD 220, second ILD 240 may be deposited, and portions removed (for example, via a polishing technique such as CMP) as described above. In some embodiments, the methods described here in contemplate polishing first ILD 220 after deposition, but not polishing second ILD 240 after deposition.

Thereafter, a third ILD (e.g., third ILD 245) is deposited (to, among other things, adjust or level the height of various structures across the die). In one embodiment, third ILD 245 is comprised of the same materials or has the same characteristics as the material of first ILD 220.

In a manner similar to that described above in the context of the via formation, a trench opening or window is formed (using, for example, conventional photolithography and etching techniques) in third ILD 245 in which an electrical conductor (e.g., bitline) is to be formed. The bitline, in one embodiment, contacts the via which is formed in the memory array. Here, a mask is employed to pattern the ILD structure thereby removing selective portions of third ILD 245 to form the trench opening or window in the logic area. After forming the via opening or window in the plurality of ILD structure, an electrically conductive material is deposited in the trench opening or window and portions of the electrically conductive material removed from the surface of third ILD 245 (for example, via a polishing technique such as CMP) to form the conductor. In one embodiment, the conductor electrically connects with the via and provides connection between the MTJ stack and, for example, sense, read and/or write conductors.

Although the described exemplary embodiments disclosed herein are directed to various magnetoresistive-based devices and methods for making such devices, the present disclosure is not necessarily limited to the exemplary embodiments. Instead, the disclosed aspects are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications, and equivalents as may be included within the spirit and scope of the inventions so that those skilled in the art should understand that they can make various changes, substitutions, and alterations without departing from the spirit and scope of the inventions in their broadest form.

In some embodiments, the disclosed magnetoresistive stacks/structures may be an MTJ-based stack/structure having an out-of-plane magnetic anisotropy (which includes perpendicular magnetic anisotropy) or an in-plane magnetic anisotropy. The present disclosure is applicable to all forms or types of magnetoresistive stacks/structures. Moreover, the free magnetic region may be disposed on or above the dielectric material that forms the tunnel barrier or beneath the tunnel barrier; the fixed magnetic region would be disposed on and interface a side of the tunnel barrier which is opposite to the side that interfaces the free magnetic region. Moreover, the magnetoresistive stacks/structures of the present inventions may include multiple tunnel barriers and/or multiple magnetic tunnel barriers (i.e., magnetic regions disposed on both interfaces of the dielectric material of the tunnel barrier).

Although the described exemplary embodiments disclosed herein are directed to various magnetoresistive stacks/structures and methods for making such stacks/structures, the present disclosure is not necessarily limited to the exemplary embodiments, which illustrate inventive aspects that are applicable to a wide variety of semiconductor processes, stacks/structures, and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications, and equivalents as may be included within the spirit and scope of the inventions so that those skilled in the art should understand that they can make various changes, substitutions, and/or alterations without departing from the spirit and scope of the inventions in their broadest form.

Although various embodiments of the present disclosure have been illustrated and described in detail, it will be readily apparent to those skilled in the art that various modifications may be made without departing from the present disclosure or from the scope of the appended claims.

What is claimed is:

1. A method of fabricating an integrated circuit device having a magnetoresistive device, comprising:
   forming the magnetoresistive device on a first portion of a substrate;
   depositing a first dielectric material over the magnetoresistive device;
   depositing a second dielectric material over the first dielectric material, wherein a dielectric constant of the second dielectric material is higher than a dielectric constant of the first dielectric material;
   polishing a surface of the second dielectric material, wherein the polishing is halted before the first dielectric material is exposed;
   forming a first cavity through the polished surface of the second dielectric material; and
   depositing an electrically conductive material in the first cavity to form a via.

2. The method of claim 1, wherein the first dielectric material is a low-k or an ultra low-k dielectric material and the second dielectric material is a conventional dielectric material.

3. The method of claim 1, wherein the magnetoresistive device includes a plurality of magnetic regions separated by an intermediate region.

4. The method of claim 1, wherein the polishing is halted when the first dielectric material is exposed.

5. The method of claim 1, further comprising:
   polishing a portion of the first dielectric material above the magnetoresistive device while polishing the surface of the second dielectric material.

6. The method of claim 1, further comprising:
   depositing a third dielectric material after forming the via;
   polishing a surface of the third dielectric material;
   forming a second cavity through the polished surface of the third dielectric material to expose a surface of the via; and
   depositing a second electrically conductive material in the second cavity.

7. The method of claim 6, wherein a dielectric constant of the third dielectric material is lower than a dielectric constant of the second dielectric material.

8. The method of claim 6, wherein the third dielectric material is a low-k or an ultra low-k dielectric material.

9. The method of claim 6, wherein a dielectric constant of the second dielectric material is higher than a dielectric constant of each of the first dielectric material and the third dielectric material.

10. A method of fabricating an integrated circuit device having a magnetoresistive device, comprising:
    forming the magnetoresistive device;
    depositing a first dielectric material over the magnetoresistive device;
    polishing a surface of the first dielectric material, wherein the polishing is halted before the magnetoresistive device is exposed;
    depositing a second dielectric material over the polished surface of the first dielectric material;
    etching through the second dielectric material and the first dielectric material by adjusting etchant chemistry to form a first cavity; and
    depositing an electrically conductive material in the first cavity to form a via.

11. The method of claim 10, wherein a dielectric constant of the second dielectric material is higher than a dielectric constant of the first dielectric material.

12. The method of claim 10, wherein the first dielectric material is a low-k or an ultra low-k dielectric material and the second dielectric material is a conventional dielectric material.

13. The method of claim 10, wherein the magnetoresistive device includes a plurality of magnetic regions separated by an intermediate region.

14. The method of claim 10, further comprising:
    depositing a third dielectric material after forming the via;
    polishing a surface of the third dielectric material;
    forming a second cavity through the polished surface of the third dielectric material to expose a surface of the via; and
    depositing an electrically conductive material in the second cavity.

15. The method of claim 14, wherein a dielectric constant of the third dielectric material is lower than a dielectric constant of the second dielectric material.

16. The method of claim 14, wherein the third dielectric material is a low-k or an ultra low-k dielectric material.

17. The method of claim 14, wherein the second dielectric material is a conventional dielectric material.

18. The method of claim 14, wherein a dielectric constant of the second dielectric material is higher than a dielectric constant of each of the first dielectric material and the third dielectric material.

\* \* \* \* \*